(12) United States Patent
Riegel et al.

(10) Patent No.: US 10,236,445 B2
(45) Date of Patent: Mar. 19, 2019

(54) ORGANIC OPTOELECTRONIC COMPONENT AND METHOD FOR PRODUCING AN ORGANIC OPTOELECTRONIC COMPONENT

(71) Applicant: OSRAM OLED GmbH, Regensburg (DE)

(72) Inventors: Nina Riegel, Tegernheim (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/557,835

(22) PCT Filed: Mar. 8, 2016

(86) PCT No.: PCT/EP2016/054933
§ 371 (c)(1),
(2) Date: Sep. 13, 2017

(87) PCT Pub. No.: WO2016/146439
PCT Pub. Date: Sep. 22, 2016

(65) Prior Publication Data
US 2018/0294413 A1    Oct. 11, 2018

(30) Foreign Application Priority Data
Mar. 13, 2015    (DE) .......... 10 2015 103 742

(51) Int. Cl.
*H01L 51/00* (2006.01)
*H01L 51/52* (2006.01)
*H01L 51/56* (2006.01)

(52) U.S. Cl.
CPC ...... *H01L 51/0007* (2013.01); *H01L 51/0014* (2013.01); *H01L 51/5253* (2013.01); *H01L 51/56* (2013.01)

(58) Field of Classification Search
CPC .. H01L 51/0007; H01L 51/56; H01L 51/5253
See application file for complete search history.

(56) References Cited

U.S. PATENT DOCUMENTS 8,840,808 B2 * 9/2014 Kakimoto .......... H01L 51/0007
                                                    252/301.16
9,093,666 B2 * 7/2015 Young ................ H01L 51/5237
(Continued)

FOREIGN PATENT DOCUMENTS

WO    2006085456 A1    8/2006
WO    2014145609 A1    9/2014

OTHER PUBLICATIONS

German Search Report based on application No. 10 2015 103 742.4 (12 pages) dated Feb. 22, 2016 (for reference purpose only).
(Continued)

*Primary Examiner* — William Coleman
(74) *Attorney, Agent, or Firm* — Viering, Jentschura & Partner MBB

(57) ABSTRACT

According to the present disclosure, a method for producing an optoelectronic component is provided. The method includes forming an organic first layer above a substrate, and forming an organic second layer above the first surface region. The first layer includes a surface. The surface is opposite the substrate and includes a first surface region and a second surface region. The second surface region surrounds the first surface region. The second surface region remains free of the second layer. The first layer and the second layer differ in their chemical composition.

20 Claims, 8 Drawing Sheets

(56) References Cited

U.S. PATENT DOCUMENTS

| | | | |
|---|---|---|---|
| 9,947,872 B2* | 4/2018 | Fennimore | C07C 211/54 |
| 2010/0289019 A1 | 11/2010 | Katz et al. | |
| 2013/0256603 A1* | 10/2013 | Chesterfield | H01L 51/0007 |
| | | | 252/500 |
| 2015/0340629 A1* | 11/2015 | Wang | H01L 51/5056 |
| | | | 257/40 |
| 2017/0229654 A1* | 8/2017 | Gao | H01L 51/0035 |

OTHER PUBLICATIONS

International Search Report based on application No. PCT/EP2016/054933 (7 pages) dated Jun. 1, 2016 (for reference purpose only).

Meerholz, "Enlightening solutions", Nature, vol. 437, Issue 7057, pp. 327-328, Sep. 2005.

Singh et al., "Inkjet Printing—Process and Its Applications", vol. 22, Issue 6, pp. 673-685, 2010.

* cited by examiner

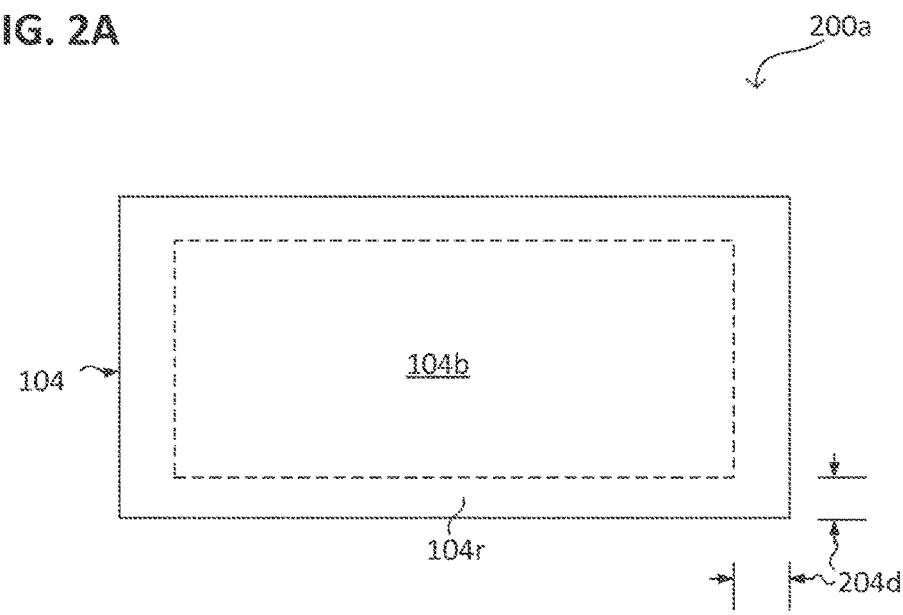
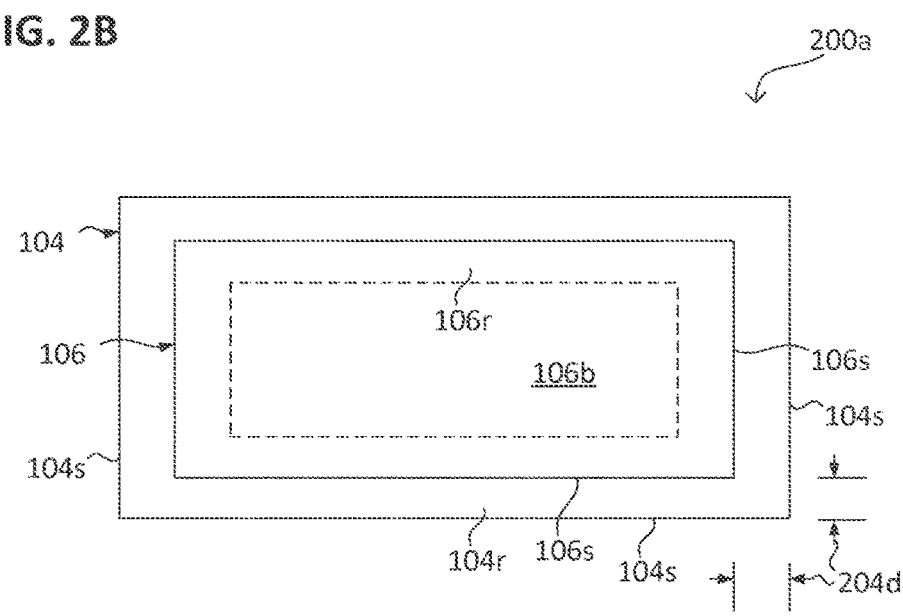

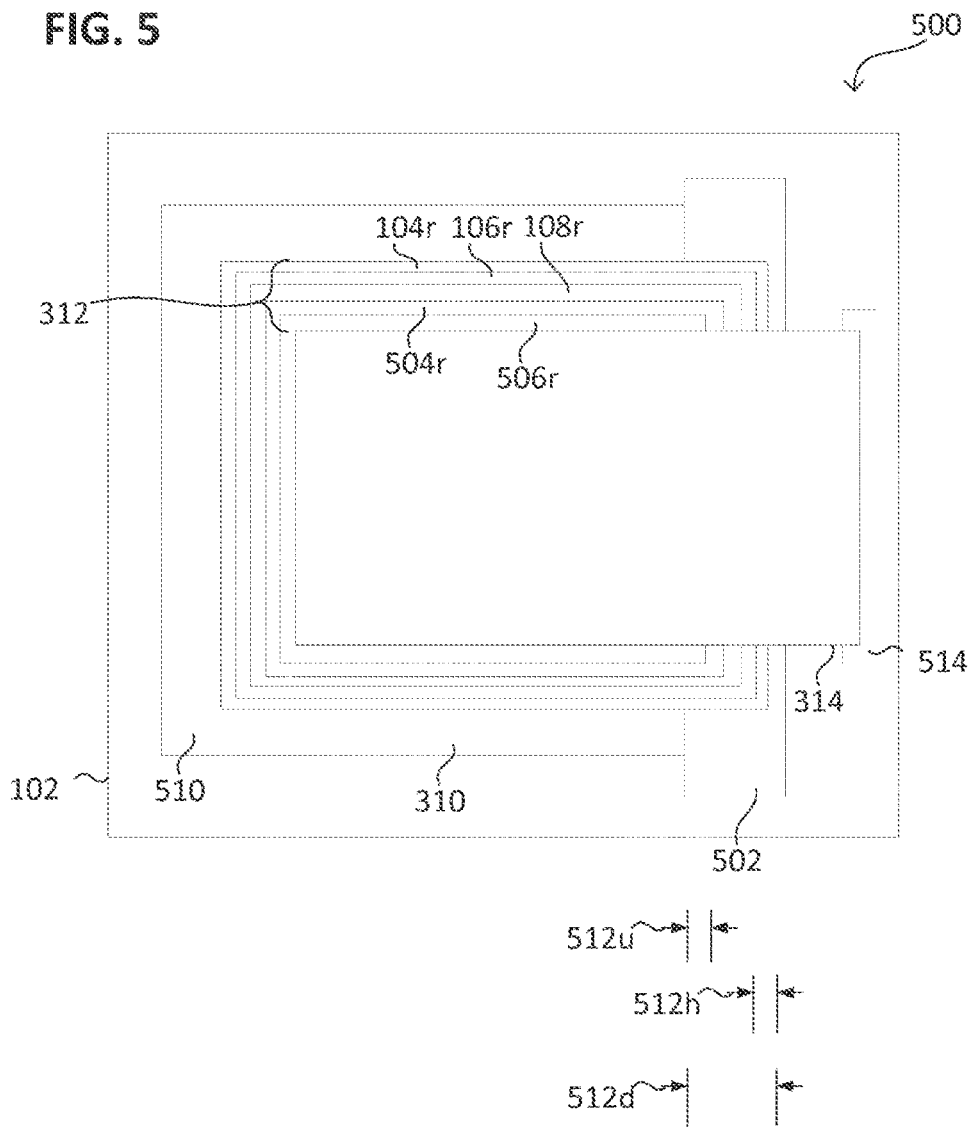

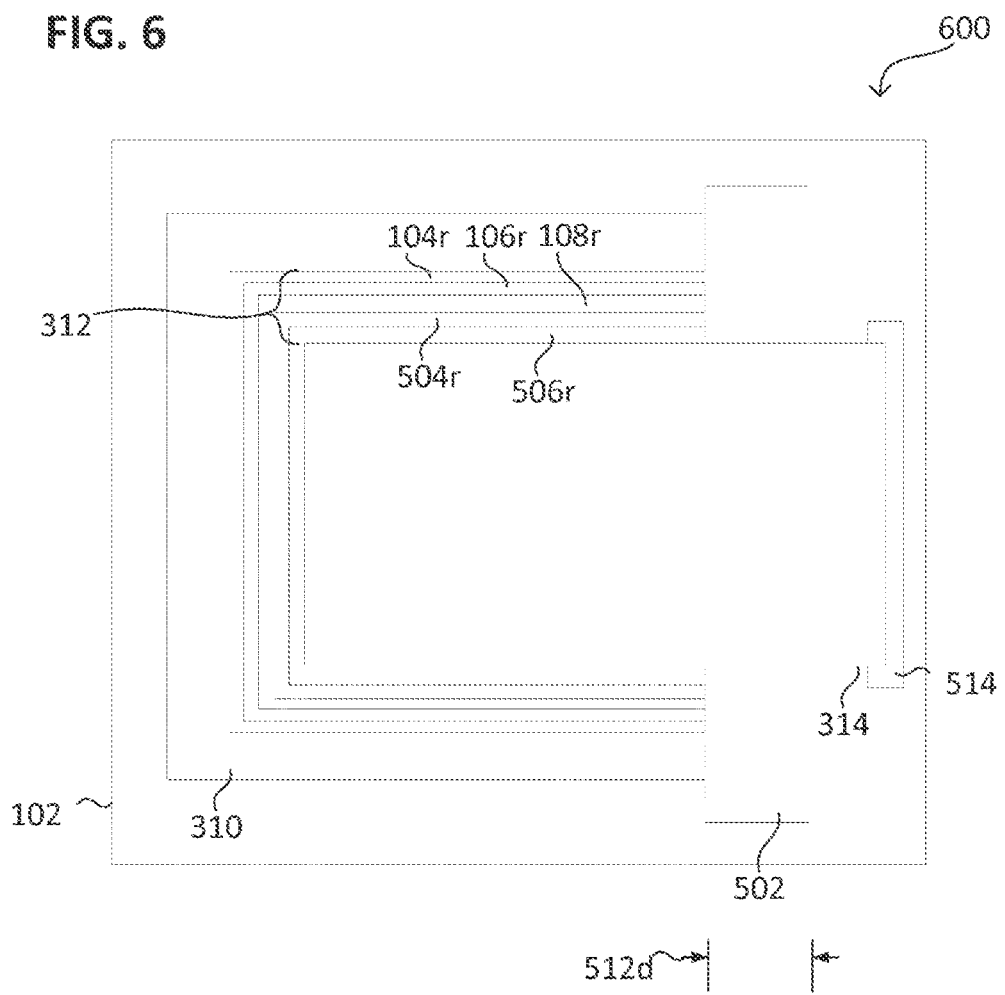

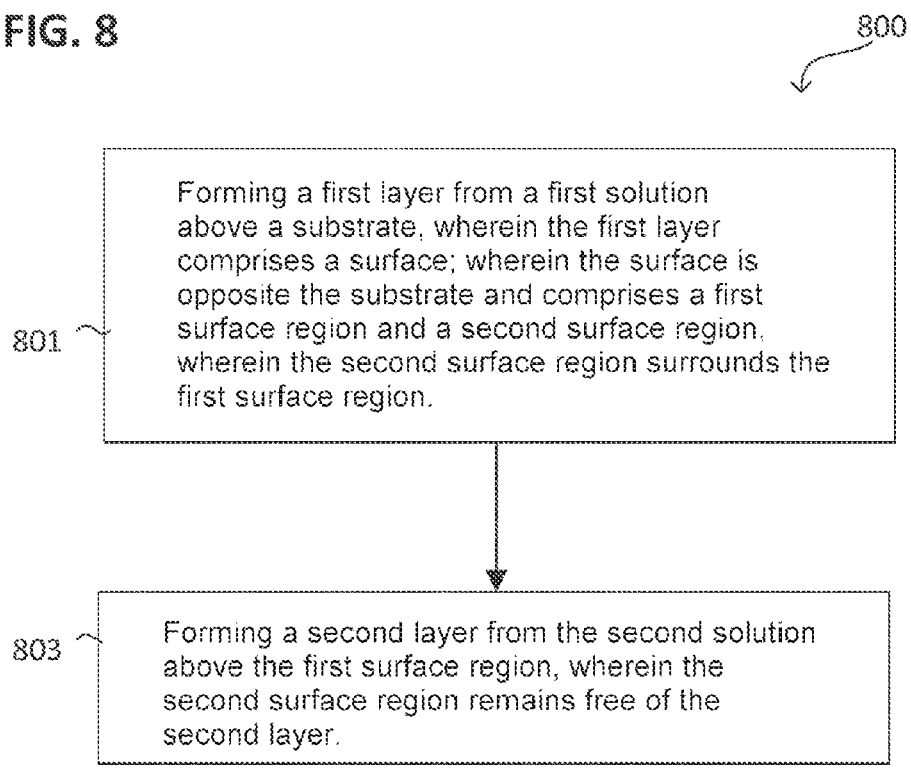

ORGANIC OPTOELECTRONIC COMPONENT AND METHOD FOR PRODUCING AN ORGANIC OPTOELECTRONIC COMPONENT

RELATED APPLICATIONS

The present application is a national stage entry according to 35 U.S.C. § 371 of PCT application No.: PCT/EP2016/054933 filed on Mar. 8, 2016, which claims priority from German application No.: 10 2015 103 742.4 filed on Mar. 13, 2015, and is incorporated herein by reference in its entirety.

TECHNICAL FIELD

The present disclosure relates to an organic optoelectronic component and to a method for producing an organic optoelectronic component.

BACKGROUND

In general, layer s composed of organic semiconductors (also referred to as organic layer s) can be used for a variety of applications, e.g. for converting electrical energy into light or for converting light into electrical energy. By way of example, it is possible to produce organic light emitting diodes (OLEDs) which are used in electronic devices, e.g. in displays of TV sets, advertising panels or mobile radio devices, or as a planar light source for generating light.

Organic light emitting diodes (OLEDs) having high efficiency include a layer stack of many materials and material mixtures which fulfill different functions (e.g. transporting or injecting charge carriers, blocking individual charge carriers, trapping charge carrier pairs and forming excitons and subsequently emitting light). These multilayered OLEDs can be produced either by means of vacuum processing or by means of so-called hybrid processing, in which a plurality of layer s (e.g. up to three) are processed from a solution (i.e. as liquid phase) and the remaining layer s are processed in the vacuum. A limiting factor here for a multilayered solution-processed OLED (also referred to as liquid-phase-processed OLED) is that already existing layer s are incipiently dissolved during the subsequent wet-chemical process steps. In the case of planar coating methods such as e.g. spincoating, the entire layer stack can be stripped away and float away, i.e. e.g. slip away, as soon as a solvent in which at least one existing layer is soluble is used for subsequent layer s.

It is conventional practice for at least two solution-processed layer s to be crosslinked with one another in order to improve their connection to one another. However, this reduces the lifetime of the OLED in comparison with vacuum-processed components as a result of the additional materials necessary for the crosslinking or as a result of residues that remain as a result of the crosslinking.

In processing methods with a structuring capability (e.g. slot die coating, inkjet printing or screen printing), passage underneath existing layer s is observed primarily in the edge regions. By way of example, a first layer in polar solvent (e.g. water, dichloromethane, tetrahydrofuran, N-methyl-2-pyrrolidone (NMP)), thereabove a second layer in apolar solvent (e.g. toluene or xylene) and thereabove a third layer once again in a polar solvent (e.g. alternatives to water such as e.g. dichloromethane, tetrahydrofuran or NMP) are applied. During application layer by layer, the problem occurs that the solvent of the third layer incipiently dissolves the edge regions of the first layer as a result of passage underneath. Analogously thereto, the second layer would be incipiently dissolved in the edge region as a result of passage underneath if a fourth layer once again composed of an apolar solvent is applied. The solvent of the topmost layer passes beyond the region to be coated and incipiently dissolves already existing layer s which have a certain solubility in the new solvent. As a result, undesired mixing can occur primarily in the edge regions (up to a few mm). This adversely affects the functionality of the entire layer stack and the homogeneity of the emission color and also the lifetime of the OLED.

It is conventional practice to construct multilayered components in a solution-processed manner by applying successive layer s from so-called orthogonal solvents (e.g. one polar, the other apolar). In this case, the already existing layer is insoluble in the solvent of the subsequently applied layer. This method is limited to a maximum of four layer s, wherein polar and apolar solvents alternate, or are supplemented by perfluorinated solvents, which represent an intermediate class.

If more layer s are intended to be processed, then the existing layer s are completely stripped away, depending on the coating method. Primarily in the edge regions of the active surfaces it is observed that existing layer s swell and undesired mixing of the layer s takes place, which adversely affects the functionality of the OLED. The difficulty or adverse effect in the edge regions becomes apparent in coating methods with a structuring capability, inter alia. In the case of planar coating methods such as spincoating or dip-coating, the entire layer is often observed to float away.

SUMMARY

In accordance with various embodiments, a method for producing an optoelectronic component (e.g. an OLED) is provided which makes it possible to form a plurality of layer s one above another in a solution-processed manner, without one or more layer s being incipiently dissolved or even stripped away, and which prevents mixing of the layer s with one another.

In accordance with various embodiments, the number of stackable solution-processed layer s can be increased and a faster throughput and lower area costs can be made possible for large processed areas on account of a higher material utilization. By way of example, more than three, more than four, more than five, more than six, more than seven, more than eight or more than nine layer s can be formed one above another, e.g. more than ten, e.g. more than twenty, layer s can be stacked one above another in a solvent-processed manner, and can form a so-called layer stack. This can considerably reduce costs since the production method can be simplified and there is less need to have recourse to expensive processing steps (e.g. in a vacuum). Furthermore, this can make it possible to carry out the production of an optoelectronic component in a continuous coating installation, e.g. from roll to roll.

In accordance with various embodiments, the number of required solvents or solvent types can be reduced, as a result of which stock keeping costs and production costs can be reduced, in particular since it is possible to have recourse to inexpensive solvents. By way of example, in accordance with various embodiments, only one polar and one apolar solvent are required, independently of the number of layer s to be produced in the layer stack.

Furthermore, in accordance with various embodiments, an optoelectronic component is provided which can be produced by said method.

In accordance with various embodiments, a method for producing an optoelectronic component includes the following: forming a first layer above or on a substrate, wherein the first layer includes a surface; wherein the surface is opposite the substrate and includes a first surface region and a second surface region, wherein the second surface region partly or completely surrounds the first surface region; forming a second layer above or on the first surface region, wherein the second surface region remains free of the second layer.

The first layer can be an organic layer, an inorganic layer or a hybrid layer. Alternatively or additionally, the second layer can be an organic layer, an inorganic layer or a hybrid layer.

The first surface region can also be understood as a deposition region, above or on which the second layer is intended to be deposited, and the second surface region can also be referred to as an edge region or free region, which is intended to remain free of the second layer.

Illustratively, the second surface region can adjoin the outer edge of the first layer. By virtue of the fact that the second surface region remains free of the second layer, material of the second layer can be prevented from passing over the outer edge. In other words, the second layer can remain on the surface of the first layer, without passing underneath at the edges thereof.

The second layer can be formed at a distance from the outer edge of the first layer, e.g. as viewed in a lateral direction (i.e. along the surface of the first layer or projected onto a plane running parallel to the surface of the first layer). The outer edge of a layer can be defined for example by a side surface of the layer and/or can define the extent of the layer. To put it another way, the second layer can be formed in a manner drawn back from the edge of the first layer.

In accordance with various embodiments, an extent of the second surface region, i.e. a distance between the second layer and the edge or the side surface of the first layer, can have a value which is greater than the layer thickness of the second layer, e.g. 10% greater than the layer thickness of the second layer, e.g. 30% greater than the layer thickness of the second layer, e.g. 50% greater than the layer thickness of the second layer, e.g. 100% greater than the layer thickness of the second layer.

By way of example, the extent of the second surface region can have a value of greater than 0.1 mm, e.g. of greater than 0.5 mm, e.g. of greater than 1 mm, e.g. in a range of approximately 0.1 mm to approximately 10 mm, e.g. in a range of approximately 0.5 mm to approximately 5 mm.

In accordance with various embodiments, the first layer and the second layer can be applied by means of liquid phase processing, i.e. as a solution. The first layer can illustratively serve as a barrier which protects layer s of the optoelectronic component formed below the first layer from being dissolved (in other words from being incipiently dissolved) by a solvent of the second layer. Further layer s can be formed between the first layer and the second layer (e.g. if more than two different solvents/solvent types are used), which further layer s can be covered e.g. by the second layer.

In accordance with various embodiments, the second layer may include a solvent (also referred to as second solvent, e.g. an organic solvent) configured in such a way that it (the solvent) substantially does not dissolve a material of the first layer. In other words, the second solvent can be configured in such a way that a material of the first layer is sparingly soluble in the second solvent.

In accordance with various embodiments, successively (e.g. in physical contact with one another) formed layer s can be processed from solvents respectively orthogonal to one another.

In accordance with various embodiments, forming a layer (the first layer and/or the second layer) may include applying the layer as a solution above or on the substrate. The solution may include in each case a solvent (e.g. an organic solvent) and a layer material (e.g. an organic material, an inorganic material and/or a hybrid material) which is dissolved in the solvent.

In accordance with various embodiments, the first layer and the second layer can differ in their chemical composition (e.g. of the layer material and/or of the solvent). By way of example, the first layer and the second layer can differ in at least one material (e.g. layer material and/or solvent).

Alternatively or additionally, the first layer and the second layer can differ in their solubility in a predefined solvent. The predefined solvent can be for example a solvent either of the first layer or of the second layer. In other words, either the first layer or the second layer can be processed by means of the predefined solvent.

Alternatively or additionally, the first layer and the second layer can differ in their conductivity (e.g. their electrical conductivity, their optical conductivity, their chemical conductivity and/or their thermal conductivity) and/or their optical activity (quantity and/or wavelength of emitted electromagnetic radiation upon excitation of the layer). By way of example, the first layer and the second layer can differ in their barrier effect (e.g. their electrical barrier effect, their chemical barrier effect and/or their thermal barrier effect). By way of example, the optical conductivity can also be referred to as transparency. By way of example, the chemical conductivity can also be referred to as diffusivity (property of enabling substances to spread through the layer). The diffusivity can be described by the diffusion coefficient. In other words, the first layer and the second layer can differ in their diffusion coefficient.

The first layer and/or the second layer can be an optically active layer, i.e. can be configured for emitting light.

In accordance with various embodiments, the material of the first layer can be a solvent of the first layer or can be a layer material of the first layer (e.g. an organic material of the first layer) which is dissolved in the solvent of the first layer.

In accordance with various embodiments, the first layer can be processed from a solvent, or have a significant solubility in a solvent.

In accordance with various embodiments, the first layer may include a solvent (also referred to as first solvent), e.g. of a first solvent type, and the solvent of the second layer e.g. can be a solvent of a second solvent type, wherein the first solvent and the second solvent are orthogonal to one another (in other words, the two solvents can be sparingly soluble or insoluble in one another). By way of example, the material (s) of the first layer can be soluble in the solvent of the second layer more poorly, e.g. more poorly by at least one order of magnitude, e.g. two orders of magnitude, than in the solvent of the first layer (this is also referred to as relative solubility). In that case, the solvent of the first solvent type and of the second solvent type can also differ from one another, e.g. be orthogonal to one another.

In other words, the relative solubility of the materials which form the layer s and are processed from a solution in the different solvents can influence the incipient dissolving.

In other words, the better the solubility of a material of an existing layer in a solvent which is used for processing a subsequent layer, the faster and more extensively the existing layer is incipiently dissolved upon contact with the solvent.

The solvents of the different (e.g. successively applied) layer s can be orthogonal to one another. A low solubility of the solvents used with respect to one another (e.g. as a result of their orthogonality to one another) can amplify this effect, but it is not necessarily required, e.g. if after the drying of the respective last layer no solvent remains in the layer or in the layer stack.

In accordance with various embodiments, the first solvent and/or the second solvent can be in each case one from the following group of solvent types:

perfluorinated solvent (also referred to as fluorine-based solvent), hydroxylic solvent (also referred to as solvent including a hydroxyl group or as a protic solvent, e.g. water-based solvent), apolar organic solvent (also referred to as aprotic apolar solvent), or aprotic polar solvent.

Illustratively, respectively successive layer s are processed from solvent types (also referred to as solvent groups) which are orthogonal to one another (e.g. polar solvent and apolar solvent).

In accordance with various embodiments, forming the first layer may include at least partly, i.e. partly or completely, extracting the solvent of the first layer from the layer in order to dry the first layer before the second layer is formed. Once the solvent has been extracted from the layer, a material of the layer (also referred to as layer material) can remain, e.g. in the form of a solid, which is part of the layer or forms the layer. The layer material may include or be formed from an organic material, an inorganic material or an organic-inorganic material.

Alternatively, the second layer can be formed before the solvent is extracted from the first layer. If the second layer is formed before the solvent is completely (or substantially completely) extracted from the first layer, it is possible for example to prevent a material of the first layer from being dissolved by additionally or alternatively making use of the fact that the first solvent and the second solvent are substantially immiscible with one another; by way of example, the first solvent and the second solvent can be configured as hydrophobic, hydrophilic, lipophobic or lipophilic, such that they are sparingly miscible in one another (can be understood analogously to sparingly soluble in one another). In this case, extracting the first solvent from the first layer and extracting the second solvent from the second layer can be carried out simultaneously.

In accordance with various embodiments, the first layer and/or the second layer can be part of an organic light emitting diode, i.e. include or form a layer of the organic light emitting diode. By way of example, the first layer and/or the second layer can be part of a barrier layer, insulation layer or electrode (also referred to as contact layer) or form the latter.

In accordance with various embodiments, the first layer and/or the second layer can be part of an optically functional layer structure which is configured for converting electrical energy into electromagnetic radiation (can also be referred to as optical activity). The optically functional layer structure can be part of the organic light emitting diode.

In accordance with various embodiments, the first layer and/or the second layer can be formed as a dissolving stop layer, wherein the dissolving stop layer has a layer thickness of less than 20 nm, e.g. in a range of approximately 1 nm to approximately 20 nm, e.g. a layer thickness of less than 10 nm, e.g. a layer thickness of less than 5 nm. The dissolving stop layer can illustratively be arranged between two layer s of the optically functional layer structure, and act as a barrier which protects the layer formed underneath from being incipiently dissolved by a solvent of a layer formed thereabove.

In accordance with various embodiments, the dissolving stop layer may include an organic semiconductor or a metal oxide and can alternatively or additionally be formed as transparent. A high transparency of the dissolving stop layer is advantageous, for example, if light is intended to be transmitted through the latter, since a high luminous efficiency of the optoelectronic component is thus achieved, the greater the transparency of the dissolving stop layer.

In accordance with various embodiments, the first layer and/or the second layer can be formed as a metallization layer, wherein the metallization layer includes exposed contact regions. In other words, the first layer and/or the second layer can be part of a wiring structure or part of a contact structure (having one or a plurality of contact layer s) or form the latter.

In accordance with various embodiments, the method can furthermore include forming an encapsulation above or on the substrate, which encapsulation covers the first layer and the second layer. The encapsulation can illustratively prevent or at least make it more difficult for environmental influences to penetrate into the interior of the optoelectronic component, such that a lifetime of the first and second layer s can be increased.

In accordance with various embodiments, an optoelectronic component may include the following: a substrate; a first layer, wherein the first layer includes a surface; wherein the surface is opposite the substrate and includes a first surface region and a second surface region, wherein the second surface region surrounds the first surface region; and a second layer above or on the first surface region, wherein the second surface region is free of the second layer.

In accordance with various embodiments, the second layer may include a material which is soluble in a solvent (e.g. the second solvent), and the first layer may include a material which is substantially insoluble in the solvent. In other words, a material of the first layer substantially cannot dissolve in a solvent in which a material of the second layer is soluble.

In accordance with various embodiments, a method for producing an optoelectronic component may include the following: forming a first layer above or on the substrate, wherein the first layer includes a first solvent, e.g. of a first solvent type, wherein the first layer includes a surface opposite the substrate and including a first surface region and a second surface region, which surrounds the first surface region; forming a second layer above or on the first surface region, wherein the second layer includes a second solvent, e.g. of a second solvent type, and wherein the second surface region remains free of the second layer; and wherein the first solvent is configured as orthogonal to the second solvent. By way of example, the first solvent type can differ from the second solvent type, e.g. the first solvent type can be orthogonal to the second solvent type.

In accordance with various embodiments, a method for producing a layer stack may include the following: forming a first layer from a first solution above a substrate, wherein the first layer includes a surface; wherein the surface is opposite the substrate and includes a first surface region and a second surface region, wherein the second surface region surrounds the first surface region; forming a second layer from a second solution above the first surface region, wherein the second surface region remains free of the second layer.

The second solution may include a solvent which substantially does not dissolve a material (e.g. a solvent or a layer material) of the first layer. In other words, the relative solubility of the layer s with respect to one another, e.g. a material of the first layer in a solvent of the second layer, can be low or vanishing.

Two solvents (or their solvent types) are orthogonal to one another if e.g. one is polar and the other is apolar. Substances which dissolve in a polar solvent are usually insoluble or at least sparingly soluble in an apolar solvent. In this regard, by means of orthogonal solvents it is possible to deposit two or more layer s from a solution one above another, without a layer that has already been deposited being dissolved again.

If the solvent types of two solvents are orthogonal to one another, the two solvents are also orthogonal to one another. By contrast, two solvents of the same solvent type can be soluble in one another or miscible in one another, i.e. non-orthogonal to one another.

Aprotic polar solvent and hydroxylic solvent are polar solvents, that is to say that these solvents include molecules having a dipole moment. A polar solvent can be understood to mean that it includes molecules having a dipole moment of more than 0.5 debye (corresponding approximately to $1.66 \cdot 10^{-30}$ C·m), e.g. in a range of approximately $1.366 \cdot 10^{-30}$ C·m to approximately $60 \cdot 10^{-30}$ C·m, e.g. of more than $2 \cdot 10^{-30}$ C·m, e.g. of more than $5 \cdot 10^{-30}$ C·m, e.g. of more than $10 \cdot 10^{-30}$ C·m, e.g. of more than $20 \cdot 10^{-30}$ C·m.

An aprotic polar solvent may include for example a strongly polarizing functional group (e.g. a carbonyl group or a nitrile group). By way of example, an aprotic polar solvent may include or be formed from dichlorobenzene, tetrahydrofuran and/or phenetole.

A hydroxylic solvent may include for example a functional group from which hydrogen atoms in the molecule can be split off as protons. By way of example, a hydroxylic solvent may include or be formed from water, carboxylic acid, methanol, ethanol and other alcohols. As an exception, a hydroxylic solvent can also include or be formed from an aldehyde which, in terms of its structure, would be polar aprotic, but, on account of the strongly polarized C—H bond thereof, hydrogen can be split off therefrom as proton.

Aprotic apolar solvent and perfluorinated solvents are apolar solvents, for example, that is to say that these solvents include molecules having a low or vanishing dipole moment. An apolar solvent can be understood to mean that this includes molecules having a dipole moment in a range of approximately 0 debye (corresponding to approximately 0 C·m) to approximately 0.5 debye (corresponding to approximately $1.66 \cdot 10^{-30}$ C·m), e.g. in a range of approximately 0 C·m to approximately $1 \cdot 10^{-30}$ C·m, e.g. in a range of approximately 0 C·m to approximately $0.5 \cdot 10^{-30}$ C·m, e.g. in a range of approximately 0 C·m to approximately $0.2 \cdot 10^{-30}$ C·m.

An aprotic apolar solvent can be lipophilic and hydrophobic, for example. Furthermore, particularly strongly polar substances can be only sparingly soluble in an aprotic apolar solvent. By way of example, an aprotic apolar solvent may include or be formed from alkenes, alkanes, benzenes (such as toluene), other symmetrically constructed molecules (e.g. tetramethyl-silane) and further organic solvents (such as halogenated hydrocarbons).

Perfluorinated solvent may include e.g. perfluorinated hydrocarbons (e.g. hexafluorobenzene). Perfluorinated solvent is not only apolar, but also very poorly polarizable externally and can therefore mix poorly with the other apolar solvents (e.g. organic solvents). By way of example, the miscibility can be temperature-dependent and increase with higher temperature. Perfluorinated solvent can have a low dipole moment and nevertheless dissolve substances which are more likely to be soluble in polar solvents. Therefore, perfluorinated solvent can be used to form a second layer on a first layer which was formed e.g. by means of an apolar solvent (i.e. which includes a material which is soluble in an apolar solvent), without the first layer being incipiently dissolved.

In accordance with various embodiments, two solvents can be orthogonal to one another if their electric dipole moment (the measure of polarity) is significantly different, e.g. if their electric dipole moment differs in a range of approximately $1.66 \cdot 10^{-30}$ C·m to approximately $60 \cdot 10^{-30}$ C·m, e.g. of more than $2 \cdot 10^{-30}$ C·m, e.g. of more than $5 \cdot 10^{-30}$ C·m, e.g. of more than $10 \cdot 10^{-30}$ C·m, e.g. of more than $20 \cdot 10^{-30}$ C·m.

If two solvents are orthogonal to one another, they can be sparingly soluble in one another. The more the electric dipole moment of solvents and/or materials differs, the more difficult it may be for these to dissolve one another.

A substance (e.g. a solvent or a solid, such as a layer material, e.g. an organic material) can be understood to be sparingly soluble in a solvent if it dissolves in the solvent only in small amounts, that is to say that the substance substantially does not dissolve in the solvent. A substance which substantially does not dissolve in the solvent can have for example a solubility in a range of approximately 0 g/l to approximately 10 g/l (that is to say that approximately up to 10 grams (g) of the substance dissolve in 1 liter (l) of solvent), e.g. in a range of approximately 0 g/l to approximately 1 g/l, e.g. in a range of approximately 0 g/l to approximately 0.1 g/l, e.g. in a range of approximately 0 g/l to approximately 0.01 g/l.

Illustratively, a substance can be soluble in a solvent all the more readily, the greater the similarity of the interaction forces between the molecules of the substance and the molecules of the solvent.

By way of example, the first layer is formed in a polar solvent (e.g. water, dichloromethane, tetrahydrofuran, N-methyl-2-pyrrolidone (NMP), and thereabove a second layer is formed in an apolar solvent (e.g. toluene or xylene).

Forming a layer (e.g. the first layer and/or the second layer or a different layer) of the optoelectronic component can be carried out by means of liquid phase processing (also referred to as solution processing). In liquid phase processing, the material of the layer (layer material) can be dissolved in a solvent in order to form a liquid phase of the layer (also referred to as solution). Furthermore, forming the layer may include applying the liquid phase of the layer by means of liquid phase deposition (also referred to as wet-chemical method or wet-chemical coating) on a surface to be coated (e.g. on the substrate or on a different layer of the optoelectronic component). Furthermore, forming the layer may include drying the applied liquid phase of the layer by extracting the solvent from the liquid phase of the layer, such that the liquid phase of the layer cures and is converted into a solid layer. In this case, the layer material can remain, which forms the solid layer. In other words, the layer can be formed from the liquid phase of the layer.

Liquid phase deposition can be carried out for example by means of spray coating, curtain coating, slot die coating, inkjet printing or screen printing.

In accordance with various embodiments, the liquid phase processing can be carried out using a mask (also referred to as stencil), in the case of so-called structured liquid phase processing. The mask may include a pattern, for example, which defines an area which is coated; by way of example, the pattern can have one or more shapes, such as circles, squares, rectangles, triangles, other polygons or else irregular shapes. By way of example, the pattern can be formed by means of a through opening in the mask, e.g. in a plate. Through the through opening, the solution (i.e. the liquid phase) of the layer can reach the area to be coated. In other words, the shape of the pattern can be mapped onto the coated area, such that the coated area has the shape of the pattern. In the case of coating by screen printing, the mask can be part of the coating apparatus, for example. After the layer has been formed, the mask can be removed again.

By way of example, by means of liquid phase processing, the first layer can be formed by means of a first mask, for example by the first mask being applied on a surface to be coated, e.g. on a main processing side of the substrate, and being removed again after the first layer has been formed. The first mask can have a through opening through which the first layer is applied on a surface region of the main processing side, e.g. as liquid phase of the first layer. In other words, the mask can have a through opening in accordance with the surface region to be coated of the main processing side.

For forming the second layer, a second mask can be applied on a second surface to be coated of the first layer and can be removed again after the second layer has been formed. The second mask can have a through opening through which the second layer is applied on the first surface region of the first layer, e.g. as liquid phase of the second layer. In other words, the mask can have a through opening in accordance with the first surface region, e.g. in such a way that the second surface region of the first layer remains uncoated.

The through opening of the first mask can be larger than the through opening of the second mask, such that the edge region of the first layer remains free of the second layer.

Forming a layer by means of a mask can be carried out for example with a tolerance in a range of approximately 50 µm to approximately 200 µm, e.g. with a tolerance of approximately 100 µm. That means that a lateral extent of the layer (i.e. the distance between the side surfaces thereof) can be increased or decreased by the tolerance and/or that a positioning of the layer can be carried out in a manner displaced by the tolerance. Therefore, it may be necessary for an edge region which is intended to remain free of the layer to have an extent which is greater than the magnitude of the tolerance, e.g. double the magnitude thereof, e.g. triple the magnitude thereof.

Alternatively or additionally, the structured liquid phase processing can be carried out using a nozzle which defines the region at which the liquid phase reaches the substrate. The nozzle can be moved in accordance with a predefined path over the substrate, such that the liquid phase is applied on the substrate along the path and a coated area in the form of the path is formed. If a closed area is intended to be coated, then mutually adjoining sections of the path can be so close together that newly applied liquid phase comes into contact with already applied liquid phase and is mixed therewith. By way of example, one or a plurality of shapes can be formed in this way.

If a nozzle, for example, is used for forming a layer, it is possible to increase the tolerance in the direction of the movement direction of the nozzle, e.g. in a range of approximately 0.1 mm to approximately 2 mm, e.g. approximately 1 mm.

By virtue of the structured liquid phase processing, for example, the process of uncovering regions after layer s have been formed can be obviated since the regions are not even coated in the first place; by way of example, the regions can be defined by contact pads which are or must remain uncovered for the contacting of the optoelectronic component.

Alternatively or additionally, at least some layer s can be formed by means of vacuum processing and other layer s by means of liquid phase processing, i.e. by means of so-called hybrid processing in which at least one layer (e.g. three or more layer s) are processed from a solution (i.e. as liquid phase) and the remaining layer s are processed in a vacuum.

In accordance with various embodiments, at least two, e.g. at least three, successive layer s are processed from a solution (i.e. by means of liquid phase processing). By way of example, it is possible to begin with liquid phase processing of the layer s and to process the remaining layer s in a vacuum. On account of the structured application of the layer s in accordance with various embodiments, an opposite order is also possible.

In accordance with various embodiments, forming a layer can be carried out in a liquid phase processing chamber.

In the context of this description, an optoelectronic component can be understood to mean a component which emits or absorbs electromagnetic radiation by means of a semiconductor component. The electromagnetic radiation can be for example light in the visible range, UV light and/or infrared light.

In accordance with various embodiments, an optoelectronic component can be formed as an electromagnetic radiation emitting component, e.g. as a light emitting diode (LED), as an organic light emitting diode (OLED), as a light emitting transistor or as an organic light emitting transistor. In various exemplary embodiments, the optoelectronic component can be part of an integrated circuit. Furthermore, a plurality of optoelectronic components can be provided, for example in a manner accommodated in a common housing. The plurality of optoelectronic components can for example interact with one another and e.g. generate and emit light being superimposed on one another, such that e.g. a color valence, such as e.g. white, can be set.

In accordance with various embodiments, the optoelectronic component (also referred to as organic optoelectronic component) may include at least one organic layer. Furthermore, the organic optoelectronic component can also include one or a plurality of inorganic layer s (e.g. in the form of electrodes or barrier layer s).

In accordance with various embodiments, an optoelectronic component may include or be formed from an optically functional layer structure. In accordance with various embodiments, the optoelectronic component can be formed as an organic optoelectronic component, that is to say that the optically functional layer structure may include one or a plurality of organic semiconductors, e.g. as part of an organic light emitting diode (OLED). In other words, the optically functional layer structure can be part of an optoelectronic component.

In accordance with various embodiments, the optically functional layer structure may include a plurality of organic and/or inorganic layer s which are stacked one above another and form a so-called layer stack. By way of example, more than three, more than four, more than five, more than six, more than seven, more than eight or more than nine layer s can be formed one above another, e.g. more than ten, e.g. more than twenty, layer s.

Alternatively or additionally, the optoelectronic component may include at least one further layer, e.g. a layer formed as an electrode, a barrier layer and/or an encapsulation layer. Alternatively or additionally, the optoelectronic component may include a plurality of further layer s, as mentioned above, e.g. in combination with one another.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound (e.g. graphite or graphene). In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all above-mentioned substances, for example an organic substance, an inorganic substance, and/or a hybrid substance. Furthermore, in the context of this description, a substance mixture can be understood to mean something which consists of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In the context of this description, a metal may include at least one metallic element, e.g. copper (Cu), silver (Ag), platinum (Pt), gold (Au), magnesium (Mg), aluminum (Al), barium (Ba), indium (In), calcium (Ca), molybdenum (Mo), samarium (Sm) or lithium (Li). Furthermore, a metal may include a metal compound (e.g. an intermetallic compound or an alloy), e.g. a compound including at least two metallic elements, such as e.g. bronze or brass, or e.g. a compound including at least one metallic element and at least one nonmetallic element, such as e.g. steel.

In the context of this description, an organic layer can be understood to mean a layer which includes or is formed from an organic material. Analogously thereto, an inorganic layer can be understood to mean a layer which includes or is formed from an inorganic material (e.g. an organic solid or a solvent which is organic). Analogously thereto, a metallic layer can be understood to mean a layer which includes or is formed from a metal. In the context of this description, the term "layer" encompasses all layer s which include or are formed from the materials mentioned above, e.g. an organic layer, an inorganic layer or a metallic layer, but also a hybrid layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 2A and FIG. 2B show in each case a schematic plan view or schematic cross-sectional view of an organic optoelectronic component in a method for producing an organic optoelectronic component;

FIG. 5 shows a schematic plan view of an organic optoelectronic component in a method for producing an organic optoelectronic component;

FIG. 6 shows a schematic plan view of an organic optoelectronic component in a method for producing an organic optoelectronic component;

FIG. 8 shows a method in accordance with various embodiments for producing a layer stack.

DETAILED DESCRIPTION

Figure 1A:
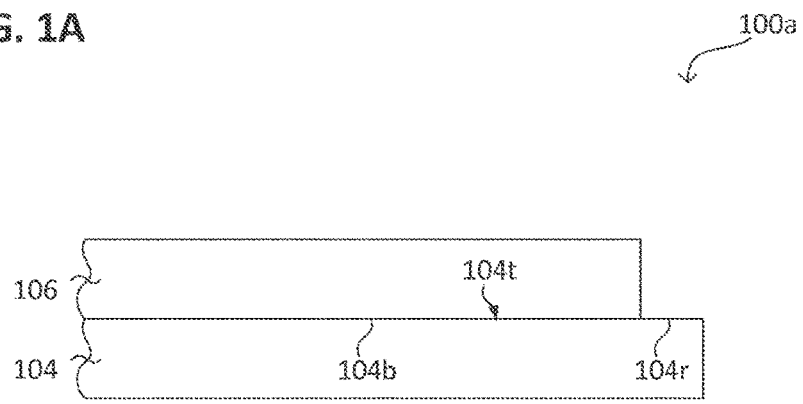
FIG. 1A and FIG. 1B show in each case a schematic cross-sectional view or schematic side view of an organic optoelectronic component in a method for producing an organic optoelectronic component.

In the following detailed description, reference is made to the accompanying drawings, which form part of this description and show for illustration purposes specific embodiments in which the present disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In connection with the process of forming layer s, the formulation "above" can be understood to mean that a layer formed above or on a surface or a component is formed in direct physical contact with the surface or the component. Furthermore, the formulation "above" can be understood to mean that one or a plurality of further layer s are arranged between the layer and the surface or the component.

In accordance with various embodiments, a lateral component architecture (layer sequence for an organic optoelectronic component) is provided, which enables liquid phase processing of as many layer s as desired from a respective solution and which prevents already existing layer s from being incipiently dissolved, in particular in the edge region thereof.

Illustratively, liquid phase processing can enable the largest possible areas to be coated at the lowest possible cost, e.g. with maximum throughput, that is to say that the largest possible areas can be coated in as little time as possible. Furthermore, the liquid phase processing enables a greater tolerance vis-à-vis fault sources, such as e.g. vis-à-vis unevennesses of the area to be coated, since these are simply leveled.

In the context of this description, incipient dissolving can be understood to mean that a layer which has already been processed, which has been e.g. partly or completely dried, i.e. from which a large part of the solvent which is present in the liquid phase of the layer during the liquid phase processing has escaped from the layer, dissolves at least partly in a solvent applied thereto, e.g. in the solvent of a further layer applied thereto.

By way of example, incipient dissolving can have the effect that part of the layer swells as a result of the action of a solvent, that is to say that the layer takes up the solvent. Furthermore, upon relatively long action of the solvent, the swollen part of the layer can transition to the liquid phase and thus dissolve in the solvent. The layer can be damaged as a result.

The component (the organic optoelectronic component) can be produced alternately from solvents respectively orthogonal to one another with the aid of liquid phase processing having a structuring capability (e.g. inkjet printing, screen printing, slot die coating or curtain coating). Upon each repetition of a solvent of an identical type (e.g. identical solvent and/or identical solvent type), the area to be coated is reduced in size such that the layer to be newly applied, even in the wet state (i.e. before the solvent has escaped), covers a smaller area than the underlying layer s that have already been processed. This prevents passage under the preceding layer processed from an orthogonal solvent.

In accordance with various embodiments, components including as many layer s as desired can be processed from the solution without requiring the use of crosslinking agents. In accordance with various embodiments, for large processed areas, a faster throughput and lower area costs are made possible on account of a higher material utilization in comparison with vacuum processing. The selection of the solvents is significantly facilitated compared with purely using orthogonal solvents, since only respectively two layer s (e.g. the first layer and the second layer) have to include solvents orthogonal to one another. By way of example, the first layer and the second layer can be formed in physical contact with one another, in other words one directly above the other.

Many materials for organic electronics are processed from (apolar) organic solvents. Therefore, in accordance with various embodiments, it is also possible to provide a construction in which very thin (e.g. with a thickness of less than 5 nm) layer s (also referred to as dissolving stop layer s) are applied between the layer s of the functional layer structure (also referred to as organically functional layer structure). These serve as a solvent stop and can function as a tunnel barrier, for example, in the OLED.

The layer serving as a solvent stop (also referred to as dissolving stop layer) can be provided for example by means of the first layer or the second layer.

FIG. 1A illustrates a schematic cross-sectional view or schematic side view of an organic optoelectronic component 100a in a method for producing an organic optoelectronic component.

The organic optoelectronic component 100a includes an organic first layer 104, wherein the first layer 104 includes a surface 104t. The surface 104t includes a first surface region 104b and a second surface region 104r or is formed therefrom. The organic optoelectronic component 100a includes an organic second layer 106, which is formed above or on the first layer 104. The second layer 106 is formed above or on the first surface region 104b in such a way that the second surface region 104r remains free of the second layer 106. In other words, the second surface region 104r and the second layer 106 do not overlap (when projected onto a plane parallel to the surface 104t).

Figure 1B:
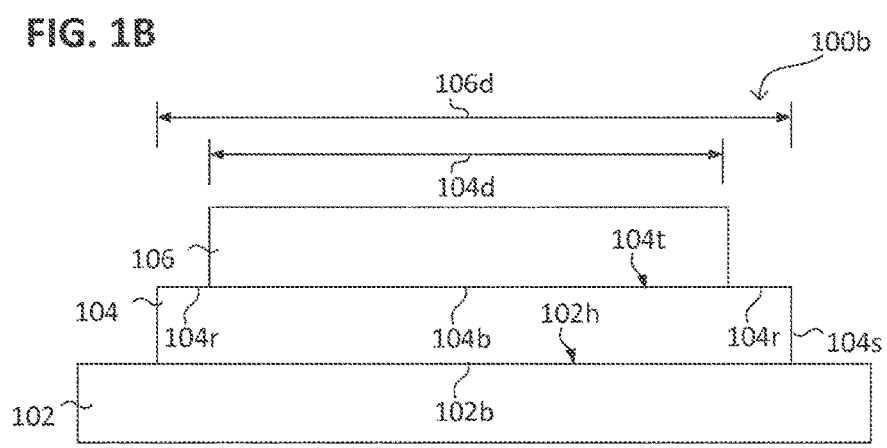

FIG. 1B illustrates a schematic cross-sectional view or schematic side view of an organic optoelectronic component 100b in a method for producing an organic optoelectronic component.

The organic first layer 104 can be formed above or on a substrate 102. The first layer 104 can be formed on a main processing surface 102h of the substrate 102, e.g. in a region 102b to be coated of the main processing surface 102h.

The surface 104t can be opposite the substrate 102 and include a first surface region 104b and a second surface region 104r. The second surface region 104r can be arranged on respectively opposite sides of the first surface region 104b and adjoin a side surface 104s of the first layer 104.

An extent 104d of the first layer 104 can be greater than an extent 106d of the second layer 106, e.g. along a first direction (which runs e.g. parallel to the surface 104t of the first layer 104). Analogously thereto, an extent (not illustrated) of the first layer 104 can be greater than an extent (not illustrated) of the second layer 106, e.g. transversely with respect to the first direction. Consequently, the first layer 104 can be extended beyond the second layer 106.

FIG. 2A and FIG. 2B illustrate in each case a schematic cross-sectional view or schematic plan view of an organic optoelectronic component 200b, e.g. of the optoelectronic component 100b illustrated in FIG. 1B, in a method for producing an organic optoelectronic component.

The second surface region 104r surrounds the first surface region 104b, as is illustrated in FIG. 2A. In other words, the second surface region 104r delimits the first surface region 104b toward the outside. To put it another way, the first surface region 104b can be arranged within the second surface region 104r.

The second surface region 104r (also referred to as edge region 104r) has an extent 204d which can be defined by the distance between the second layer 106 and an outer edge of the first layer 104, e.g. a side surface 104s of the first layer 104. By way of example, the extent 204d can be defined by the distance between a side surface 106s of the second layer 106 and a side surface 104s of the first layer 104 (e.g. when projected onto a plane parallel to the surface 104t).

The second layer 106 is formed above the first surface region 104b. Analogously to the first layer 104, the second layer 106 may include a first surface region 106b and a second surface region 106r, wherein the second surface region 106r surrounds the first surface region 106b.

The second layer 106 has a lateral extent (e.g. when projected onto a plane parallel to the surface 104t or the main processing surface) which is smaller than an extent parallel thereto of the first layer 104. In other words, the second layer 106 cannot project beyond the first layer 104 and can furthermore be formed in a manner drawn back from the outer boundary (edge) thereof.

Figure 3A:
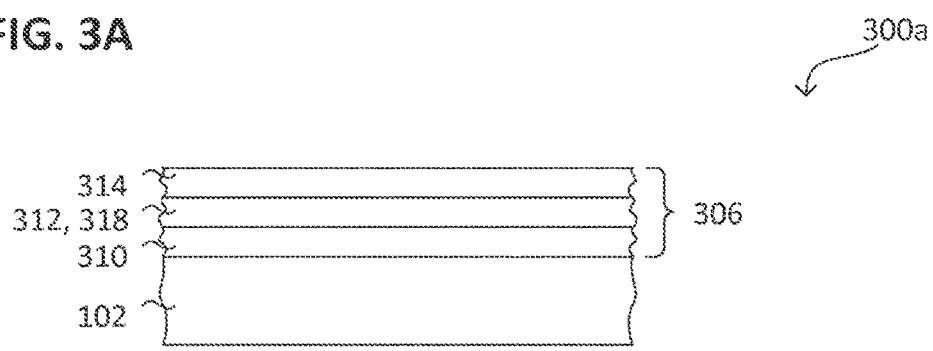
FIG. 3A, FIG. 3B and FIG. 3C show in each case a schematic cross-sectional view or a schematic side view of an organic optoelectronic component in a method for producing an organic optoelectronic component.
Figure 3B:
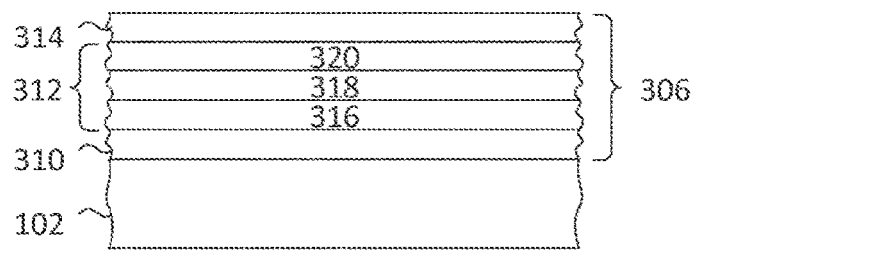
Figure 3C:
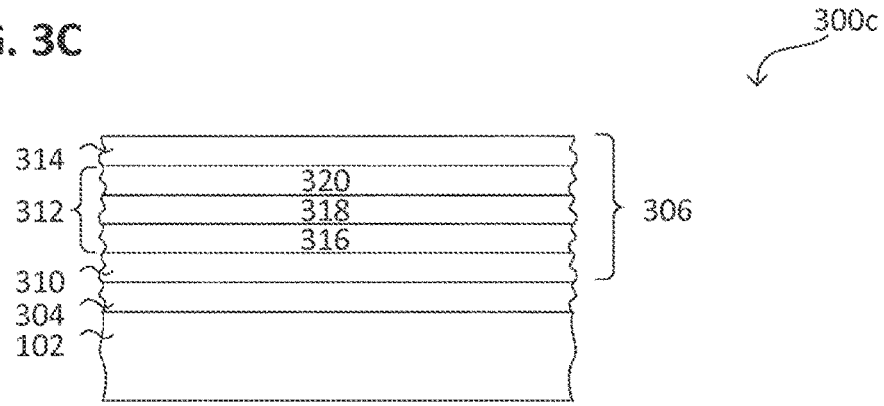

FIG. 3A to FIG. 3C illustrate in each case a schematic cross-sectional view or side view of an optoelectronic component 300a, 300b, 300c in accordance with various embodiments in a method in accordance with various embodiments for producing an optoelectronic component.

The features of the optoelectronic components 300a, 300b, 300c illustrated in FIG. 3A to FIG. 3C can be understood as an alternative or in addition to the features of the optoelectronic components as described herein above or below and can be for example part of a lighting device.

FIG. 3A illustrates a sectional illustration or side view of an organic optoelectronic component 300a in a method for producing the organic optoelectronic component 300a.

Forming the optoelectronic component 300a includes forming a first electrode 310, forming an organic functional layer structure 312 and forming a second electrode 314, which together are part of the optoelectronic component 300a and are arranged on or above or on a substrate 102 (also referred to as carrier 102).

In accordance with various embodiments, the first electrode 310, the functional layer structure 312 and the second electrode 314 form an organic light emitting diode 306 as described below and as illustrated in FIG. 3A.

The light emitting diode 306 (organic light emitting diode 306) is also referred to as luminous thin-film component including semiconducting materials and is configured for generating electromagnetic radiation (e.g. light), e.g. when an electric current for the operation of the optoelectronic component 300a flows through the functional layer structure 312 between the first electrode 310 and the second electrode 314. The electromagnetic radiation generated can be emitted at least through some layer s and constituents of the optoelectronic component 300a and away from the optoelectronic component 300a. In other words, the optoelectronic component 300a can be configured for converting electrical energy into electromagnetic radiation (e.g. light), i.e. can act as a light source.

The first electrode 310 (also referred to as bottom electrode 310 or as bottom contact) and/or the second electrode 314 (also referred to as top electrode or as top contact) can be formed in such a way that they include at least one layer. The first electrode 310 and/or the second electrode 314 can be formed in such a way that they have a layer thickness in a range of approximately 1 nm to approximately 50 nm, for example of less than or equal to approximately 40 nm, for example of less than or equal to approximately 20 nm, for example of less than or equal to approximately 10 nm.

The first electrode 310 is formed from an electrically conductive substance. The first electrode 310 is formed as an anode, that is to say as a hole-injecting electrode. The first electrode 310 is formed in such a way that it includes a first electrical contact pad (not illustrated), wherein a first electrical potential (provided by an energy source (not illustrated), for example a current source or a voltage source) can be applied to the first electrical contact pad. Alternatively, the first electrode 310 for applying a first potential can be electrically conductively connected to a first electrical contact pad. The first electrical contact pad (also referred to as contacting area) can be configured for electrically conductive contacting, e.g. for bonding or soldering. The first electrical potential can be the ground potential or some other predefined reference potential.

The functional layer structure 312 (organic functional layer structure 312) is formed on or above the first electrode 310. The functional layer structure 312 may include an emitter layer 318, for example including or composed of fluorescent and/or phosphorescent emitter materials.

The second electrode 314 is formed on or above the functional layer structure 312. The second electrode 314 is formed as a cathode, that is to say as an electron-injecting electrode. The second electrode 314 includes a second electrical terminal (in other words, a second electrical contact pad) for applying a second electrical potential (which is different than the first electrical potential), provided by the energy source. Alternatively, the second electrode 314 for applying a second potential can be electrically conductively connected to a second electrical contact pad. The second electrical contact pad can be configured for electrically conductive contacting, e.g. for bonding or soldering. The second electrical potential can be a potential that is different than the first electrical potential.

Alternatively or additionally, an electrical contact pad may include a plurality of electrical contact pads.

The first electrical potential and the second electrical potential can be generated by the energy source (e.g. a current source, e.g. a power supply unit or a driver circuit) and be applied to the first electrical contact pad and the second electrical contact pad for the purpose of operating the optoelectronic component 300a, i.e. if the optoelectronic component 300a is intended to generate electromagnetic radiation (i.e. in an on state of the optoelectronic component 300a). The first electrical potential and the second electrical potential can bring about an electric current which flows through the functional layer structure 312 and excites the latter for generating and emitting electromagnetic radiation.

The second electrical potential has a value such that the difference with respect to the first electrical potential (in other words, the operating voltage of the optoelectronic component 300a, which is applied to the optoelectronic component 300a) has a value in a range of approximately 1.5 V to approximately 20 V, for example a value in a range of approximately 2.5 V to approximately 15 V, for example a value in a range of approximately 3 V to approximately 12 V. The energy source can be configured for generating said operating voltage.

The substrate 102 can be provided as an integral substrate 102. The substrate 102 can be a monolithic substrate or a substrate constructed integrally from a plurality of layer s, wherein the plurality of layer s are fixedly connected to one another.

The substrate 102 can have various forms. By way of example, the substrate 102 can be formed as film (e.g. a metallic film or a plastics film, e.g. PE films), as a plate (e.g. a plastics plate, a glass plate or a metal plate). Alternatively or additionally, the substrate 102 may include at least one flat or at least one curved surface, e.g. a main processing surface on a main processing side of the substrate 102, on or above which the layer s of the optoelectronic component 300a (organic optoelectronic component 300a) are formed.

The substrate 102 may include or be formed from an electrically insulating substance. An electrically insulating substance may include one or a plurality of the following materials: a plastic, a composite material (e.g. a laminate including a plurality of films or a fiber-plastic composite) or a glass.

A plastic includes or is formed from one or a plurality of polyolefins (for example high or low density polyethylene (PE) or polypropylene (PP)). Furthermore, the plastic may include or be formed from polyvinyl-chloride (PVC), polystyrene (PS), polyester and/or polycarbonate (PC), polyethylene terephthalate (PET), polyethersulfone (PES) and/or polyethylene naphthalate (PEN). Alternatively or additionally, the substrate 102 can be formed in such a way that it includes one or a plurality of the substances mentioned above.

Alternatively or additionally, the substrate 102 may include or be formed from an electrically conductive substance, e.g. an electrically conductive polymer, a metal (e.g. aluminum or steel), a transition metal oxide or an electrically conductive transparent oxide.

In accordance with various embodiments, the substrate 102 can be electrically conductive. To that end, the substrate 102 may include or be formed from an electrically conductive substance or can alternatively include or be formed from an electrically insulating substance which is coated with an electrically conductive substance. The electrically conductive coating may include or be formed from an electrically conductive substance, e.g. metal (i.e. in the form of a metallic coating).

By way of example, a substrate 102 which includes or is formed from a metal can be formed as a metal film or a metal-coated film. The substrate 102 can be configured in such a way that it conducts electric current during the operation of the optoelectronic component 300a.

If the substrate 102 is electrically conductive, then the substrate 102 can serve as an electrode, e.g. as the bottom electrode 310, of the light emitting diode 306. Alternatively or additionally, the substrate 102 can be formed from or may include a substance having a high thermal conductivity.

Alternatively or additionally, the substrate 102 can be formed as light-transmissive, e.g. opaque, translucent or even transparent, with respect to at least one wavelength range of the electromagnetic radiation, for example in at least one range of visible light, for example in a wavelength range of approximately 380 nm to 780 nm.

If the substrate 102 is formed as light-transmissive, generated light can be emitted through the substrate 102. In this case, the optoelectronic component 300a is formed as a rear-side emissive light source, as a so-called bottom emitter, and that surface of the substrate 102 which faces away from the functional layer structure 312 can form a light emission surface of the optoelectronic component 300a. If a first electrode 310 is used for a bottom emitter, said first electrode can likewise be formed as light-transmissive.

If the substrate 102 is formed as light-nontransmissive, the second electrode 314 can be formed as light-transmissive. Generated light can then be emitted through the second electrode 314. In this case, the optoelectronic component 300a is formed as a front-side emissive light source, as a so-called top emitter, and that surface of the second electrode 314 which faces away from the functional layer structure 312 can form the light emission surface of the optoelectronic component 300a.

Alternatively or additionally, the substrate 102 can be configured as light-reflecting, e.g. can be part of a mirror structure or form same. What can thus be achieved is that the luminous efficiency can be increased.

In accordance with various embodiments, the optoelectronic component 300a can be formed as a transparent component, i.e. as a combination of top emitter and bottom emitter. In the case of a transparent component, both the first electrode 310 and the second electrode 310 can be formed as transparent.

The first electrode 310 can be formed from or include a metal. In the case where the first electrode 310 includes or is formed from a metal, the first electrode 310 can have a layer thickness in a range of approximately 10 nm to approximately 25 nm, for example in a range of approximately 10 nm to approximately 18 nm, for example in a range of approximately 15 nm to approximately 18 nm.

In order to form the first electrode 310 as light-transmissive, the first electrode 310 may include or be formed from a transparent conductive oxide (TCO). Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can furthermore be p-doped or n-doped, or hole-conducting (p-TCO) or electron-conducting (n-TCO).

Furthermore, for the case where the first electrode 310 includes or is formed from a transparent conductive oxide (TCO), the first electrode 310 can have for example a layer thickness in a range of approximately 50 nm to approximately 500 nm, for example a layer thickness in a range of approximately 75 nm to approximately 250 nm, for example a layer thickness in a range of approximately 90 nm to approximately 150 nm.

Alternatively or additionally, the first electrode 310 can be formed by a layer stack or a combination of the layer s described above. One example is a silver layer applied on or above an indium tin oxide layer (ITO) (Ag on ITO) or ITO-Mg-ITO multilayer s. Alternatively or additionally, the first electrode 310 may include or be formed from a layer stack of a plurality of layer s of the same metal or of different metals and/or of the same TCO or of different TCOs.

The second electrode 314 can be formed as an anode, that is to say as a hole-injecting electrode. The second electrode 314 can be formed in accordance with one or more of the above-described embodiments of the first electrode 310, e.g. identically, similarly or differently to the first electrode 310.

In accordance with various embodiments, the first electrode 110, the functional layer structure 312 and the second electrode 314 can be formed by means of liquid phase processing (cf. FIG. 1A or FIG. 1B).

To that end, at least one of the abovementioned substances for the first electrode 310 is dissolved or dispersed in a first solvent, e.g. of a first solvent type, in order to form a liquid phase of the first electrode 310. By means of the liquid phase of the first electrode 310, in accordance with various embodiments, the first electrode 310 can be formed on or above the substrate 102 (cf. FIG. 1A or FIG. 1B).

Forming the functional layer structure 312 may include dissolving or dispersing one of the substances mentioned herein for a layer of the functional layer structure 312 (e.g. an emitter layer 318) or for the functional layer structure 312 in a second solvent, e.g. of a second solvent type, in order to form a liquid phase of the functional layer structure 312, wherein the first solvent can be orthogonal to the second solvent. By way of example, the second solvent type can be different (e.g. orthogonal) with respect to the first solvent type. By means of the liquid phase of the functional layer structure 312, in accordance with various embodiments, the functional layer structure 312 or at least one layer of the functional layer structure 312 can be formed on or above the first electrode 310 (cf. FIG. 1A or FIG. 1B).

Forming the second electrode 314 may include dissolving or dispersing one of the substances mentioned herein for the second electrode 314 in a third solvent, e.g. of a third solvent type, in order to form a liquid phase of the second electrode 314, wherein the third solvent is orthogonal to the second solvent. By way of example, the third solvent type can be different (e.g. orthogonal) with respect to the second solvent type. By means of the liquid phase of the second electrode 314, in accordance with various embodiments, the second electrode 314 can be formed on or above the functional layer structure 312 (cf. FIG. 1A or FIG. 1B).

In accordance with various embodiments, the third solvent type can be identical to the second solvent type (by way of example, the first solvent can be identical to the second solvent). What can thus be achieved is that only two different solvents are required. In this case, it is possible to form the functional layer structure 312 in the form of the first layer 104 and the second electrode 314 in the form of the second layer 104. That is to say that the third solvent substantially does not dissolve a material of the functional layer structure 312.

FIG. 3B shows a schematic cross-sectional view or side view of an organic optoelectronic component 300b in accordance with various embodiments, which for example largely correspond to the exemplary embodiment shown in FIG. 3A, in a method for forming an organic optoelectronic component. As an alternative to the layer sequence illustrated in FIG. 3A, the organic optoelectronic component 300b may include the layer sequence shown in FIG. 3B, which is described below.

Forming the organic functional layer structure 312 may include forming one or a plurality of emitter layer s 318. A plurality of emitter layer s 318 can be formed for example identically or differently to one another.

Alternatively or additionally, the emitter layer 118 may include or be formed from organic polymers, organic oligomers, organic monomers, organic small, non-polymeric molecules ("small molecules") or a combination of these materials.

Alternatively or additionally, the emitter materials can be suitably embedded in a matrix material, e.g. a plastic. It should be pointed out that other suitable emitter materials can likewise be provided. Alternatively or additionally, the emitter materials of the emitter layer (s) 318 of the optoelectronic component 300b can be selected for example such that the optoelectronic component 300b emits white light. Alternatively or additionally, the emitter layer (s) 318 include (s) a plurality of emitter materials that emit in different colors (for example blue and yellow or blue, green and red); alternatively, the emitter layer (s) 318 is/are also constructed from a plurality of partial layer s, such as a blue fluorescent emitter layer 318 or blue phosphorescent emitter layer 318, a green phosphorescent emitter layer 318 and/or a red phosphorescent emitter layer 318. The mixing of the different colors can result in the emission of light having a white color impression. Alternatively, provision is made for arranging a converter material in the beam path (i.e. in the light propagation region) of the primary emission generated by said layer s, which converter material at least partly absorbs the primary radiation and emits a secondary radiation having a different wavelength, such that a white color impression results from a (not yet white) primary radiation as a result of the combination of primary radiation and secondary radiation.

The first electrode 310 is formed on or above the substrate 302. A hole injection layer is formed (not shown) on or above the first electrode 310. A hole transport layer 316 (also referred to as hole conduction layer 316) is formed on or above the hole injection layer. Furthermore, the emitter layer 318 is formed on or above the hole transport layer 316. An electron transport layer 320 (also referred to as electron conduction layer 320) is formed on or above the emitter layer 318. An electron injection layer (not shown) is formed on or above the electron transport layer 320. The second electrode 314 is formed on or above the electron injection layer.

The layer sequence of the optoelectronic component 300b is not restricted to the exemplary embodiments described above; by way of example, one or more of the layer s mentioned above can be omitted. Furthermore, alternatively, the layer sequence can be formed in an opposite order. Furthermore, two layer s can be formed as one layer.

The hole injection layer can be formed in such a way that it has a layer thickness in a range of approximately 10 nm to approximately 1000 nm, for example in a range of approximately 30 nm to approximately 300 nm, for example in a range of approximately 50 nm to approximately 200 nm.

Alternatively or additionally, the optoelectronic component 300b may include a plurality of hole injection layer s.

The hole transport layer 316 can be formed in such a way that it has a layer thickness in a range of approximately 5 nm to approximately 50 nm, for example in a range of approximately 10 nm to approximately 30 nm, for example approximately 20 nm.

Alternatively or additionally, the optoelectronic component 300b may include a plurality of hole transport layer s 316.

The electron transport layer 320 can be formed in such a way that it has a layer thickness in a range of approximately 5 nm to approximately 50 nm, for example in a range of approximately 10 nm to approximately 30 nm, for example approximately 20 nm.

Alternatively or additionally, the optoelectronic component 300b may include a plurality of electron transport layer s 320.

The electron injection layer can be formed in such a way that it has a layer thickness in a range of approximately 5 nm to approximately 200 nm, for example in a range of approximately 20 nm to approximately 50 nm, for example approximately 30 nm.

Alternatively or additionally, the optoelectronic component 300b may include a plurality of electron injection layer s.

Alternatively or additionally, the optoelectronic component 300b can be formed in such a way that it includes two or more organic functional layer structures 312, e.g. a first organic functional layer structure 312 (also referred to as first organic functional layer structure unit) and a second organic functional layer structure 312 (also referred to as second organic functional layer structure unit).

The organic second functional layer structure unit can be formed above or alongside the first functional layer structure unit. An intermediate layer structure (not shown) can be formed between the organic functional layer structure units.

The intermediate layer structure can be formed as an intermediate electrode, for example in accordance with one of the configurations of the first electrode 310. An intermediate electrode can be electrically connected to an external energy source. The external energy source can provide a third electrical potential at the intermediate electrode. However, the intermediate electrode can also include no external electrical connection, for example by the intermediate electrode having a floating electrical potential.

Alternatively or additionally, the intermediate layer structure can be formed as a charge generation layer (CGR) structure. A charge generation layer structure includes or is formed from one or a plurality of electron-conducting charge generation layer (s) and one or a plurality of hole-conducting charge generation layer (s). The electron-conducting charge generation layer (s) and the hole-conducting charge generation layer (s) are formed in each case from an intrinsically conducting substance or a dopant in a matrix. With regard to the energy levels of the electron-conducting charge generation layer (s) and the hole-conducting charge generation layer (s), the charge generation layer structure should be formed in such a way that electron and hole can be separated at the interface between an electron-conducting charge generation layer and a hole-conducting charge generation layer. Optionally, the charge generation layer structure may include a diffusion barrier, e.g. in the form of a dissolving stop layer, between adjacent layer s.

Alternatively or additionally, the abovementioned layer s can be formed as mixtures of two or more of the abovementioned layer s.

It should be pointed out that, alternatively or additionally, one or more of the abovementioned layer s arranged between the first electrode 310 and the second electrode 314 are optional.

By way of example, the organic functional layer structure 312 can be formed as a stack of two, three or four OLED units arranged one directly above another. In this case, the organic functional layer structure 312 has a layer thickness of a maximum of approximately 3 μm.

In addition, the optoelectronic component 300b can be formed in such a way that it optionally includes further organic functional layer s (which can consist of organic functional materials), for example arranged on or above the one or the plurality of emitter layer s 318 or on or above the electron transport layer (s) 216, which serve to further improve the functionality and thus the efficiency of the optoelectronic component 300b.

If the first electrode 310 is formed from a liquid phase, the hole injection layer can be formed in the form of the first layer 104, the hole transport layer 316 can be formed in the form of the second layer 106 and the emitter layer 118 can be formed in the form of a third layer (cf. for example FIG. 4A to FIG. 4D). This makes it possible to use, for forming the first electrode 310, a solvent having the same solvent type or the same solvent as for forming the hole transport layer 316 and to use, for the hole injection layer, a solvent having the same solvent type or the same solvent as for forming the emitter layer 118. Consequently, for example only two different solvents are required.

Alternatively, three different solvents can be used. By way of example, a first solvent, e.g. of a first solvent type, can be used for forming the electrode 310. A second solvent, e.g. of a second solvent type, can be used for forming the hole injection layer, wherein the first solvent is orthogonal to the second solvent. By way of example, the second solvent type can be orthogonal to the first solvent type. A third solvent, e.g. of a third solvent type, can be used for forming the hole transport layer 316, wherein the third solvent is respectively orthogonal to the first solvent and to the second solvent. By way of example, the third solvent type can be respectively orthogonal to the first solvent type and to the second solvent type. For forming the emitter layer 118, it is possible to use once again the first solvent or some other solvent of the first solvent type.

In this case, it is possible to form the hole injection layer or the hole transport layer 316 in the form of the first layer 104 and the emitter layer 118 in the form of the second layer 106 (cf. FIG. 1A or FIG. 1B). In other words, in this case it suffices to form one of the layer s between the emitter layer 118 and the first electrode 310 in the form of the first layer 104 having an exposed edge region 104r. What can thus be achieved is that fewer exposed edge regions have to be formed and more luminous area is thus available.

If the first electrode 310 is not formed from a liquid phase or is generally not soluble in any of the solvents, the scheme described above can be correspondingly altered.

By way of example, it is possible for the first electrode 110 already to be formed before the liquid phase processing, by means of a different deposition method, e.g. by means of vacuum processing, such as e.g. by means of one or more of the following methods: atomic layer deposition (ALD) method, plasma enhanced atomic layer deposition (PEALD) method, plasmaless atomic layer deposition (PLALD) method, or chemical vapor deposition (CVD) method, e.g. a plasma-enhanced chemical vapor deposition (PECVD) method or plasmaless chemical vapor deposition (PLCVD) method. Alternatively, the first electrode 110 can be provided as part of the substrate 102, e.g. in the form of the substrate or in the form of the metal layer of a metal-coated substrate 102.

FIG. 3C shows a schematic cross-sectional view or side view in accordance with various embodiments of an organic optoelectronic component 300c, which for example largely corresponds to the exemplary embodiment illustrated in FIG. 3B. As an alternative to the layer sequence shown in FIG. 3B, the organic optoelectronic component 300c may include the layer sequence illustrated in FIG. 3C and described below.

A barrier layer 304 is arranged on or above the substrate 102 and between the substrate 102 and the light emitting diode 306. The substrate 102 and the barrier layer 304 form a hermetically impermeable substrate 102. The barrier layer 304 may include or be formed from one or a plurality of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and also mixtures and alloys thereof.

In accordance with various embodiments, the barrier layer 304 can be formed for example from an electrically insulating substance (i.e. as an electrical insulator, as a so-called insulation layer).

The barrier layer 304 can be formed in such a way that it has a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The barrier layer 304 can be formed by means of vacuum processing, liquid phase processing or alternatively by means of other suitable deposition methods.

Alternatively or additionally, the barrier layer 304 can be formed in such a way that it includes a plurality of partial layer s. In the case of a barrier layer 304 including a plurality of partial layer s, all the partial layer s can be formed e.g. by means of an atomic layer deposition method. A layer sequence including only ALD layer s can also be referred to as a "nanolaminate".

Alternatively or additionally, the barrier layer 304 is formed in such a way that it includes one or a plurality of optically high refractive index materials, for example one or a plurality of material(s) having a high refractive index, for example having a refractive index of at least 2.

Alternatively or additionally, the abovementioned layer s are formed as mixtures of two or more of the abovementioned layer s.

Alternatively or additionally, one of the optoelectronic components described herein may include a color filter and/or a converter structure, which can be arranged and/or formed above or on the substrate 102. By means of targeted variation of a surface in the case of planar substrates 102 (variation of the bottom contact 310 or single-sided coating or application of a color filter or of a converter), it is possible to achieve a targeted change in the emission in one direction, independently of the emission in the other direction. This applies to nontransparent and (semi) transparent embodiments.

FIG. 4A to FIG. 4D show in each case a schematic cross-sectional view in accordance with various embodiments of an organic optoelectronic component in various process steps 400a to 400c, e.g. of one of the organic optoelectronic components described above.

Figure 4A:
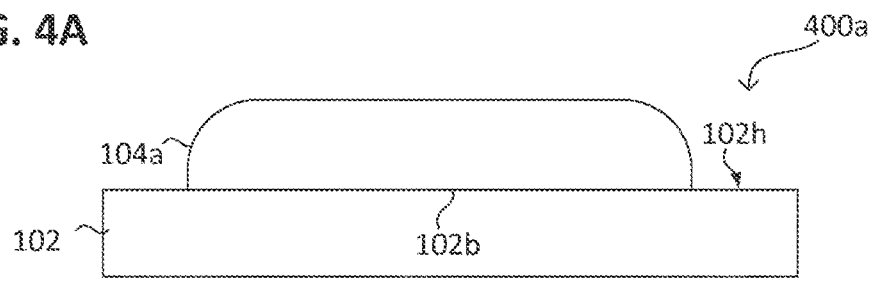
FIG. 4A, FIG. 4B, FIG. 4C and FIG. 4D show in each case a schematic cross-sectional view or a schematic side view of an organic optoelectronic component in a method for producing an organic optoelectronic component.

As is illustrated in FIG. 4A, a substance for a first layer 104 (e.g. the barrier layer, the electron injection layer, the electron conduction layer, the emitter layer, etc.) can be dissolved or dispersed in a first solvent, e.g. of a first solvent type, and a liquid phase 104a (in other words a solution) of the organic first layer 104 can be formed in the process, this also being referred to as first liquid phase 104a.

The first liquid phase 104a can be applied on or above the substrate 102, e.g. by means of liquid phase processing, e.g. on a region 102b to be coated (on the surface) of the substrate 102, e.g. on a main processing side of the substrate 102, e.g. above or on a region 102b to be coated (on the surface) of the substrate 102, e.g. above or on a main processing side 102h of the substrate 102.

Between the first liquid phase 104a and the substrate 102 it is possible to arrange further layer s (not illustrated), e.g. at least one layer (not illustrated) which was formed from a liquid phase, wherein the layer is not soluble or is sparingly soluble in the first solvent.

Alternatively or additionally, it is possible to arrange a layer or layer stack (not illustrated) which is not formed from a liquid phase, said layer or layer stack being formed e.g. by means of vacuum processing, between the substrate 102 and the first liquid phase 104a, e.g. the first electrode 110 and/or a barrier layer 304.

Figure 4B:
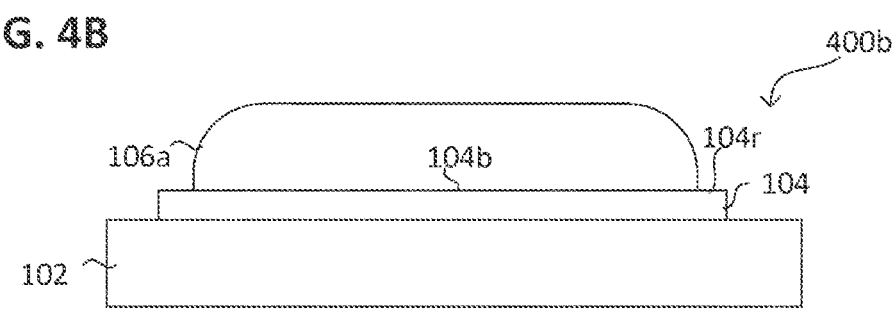

Subsequently, the first solvent can be extracted, e.g. removed, volatilized or evaporated, from the first liquid phase 104a. For this purpose, the first liquid phase 104a can be heated, for example. By extracting the first solvent, it is possible for the first liquid phase 104a to be dried and solidified. In this case, the volume of the first liquid phase 104a can decrease, e.g. all the more, the more solvent is extracted from the first liquid phase 104a. By extracting the first solvent from the first liquid phase 104a, it is possible for the liquid phase 104a to be converted into the first layer 104, as is illustrated in FIG. 4B. In other words, the first layer 104 can be formed from the first liquid phase 104a.

As is illustrated in FIG. 4B, a substance for an organic second layer 106 (e.g. the barrier layer, the electron injection layer, the electron conduction layer, the emitter layer, etc.) can be dissolved or dispersed in a second solvent, e.g. of a second solvent type, which is orthogonal to the first solvent, and a liquid phase 106a (in other words a solution) of the organic second layer 106 can be formed in the process, this also being referred to as second liquid phase 106a. The second liquid phase 106a can be applied on or above the first layer 104, e.g. by means of liquid phase processing, e.g. on a region 104b to be coated of the first layer 104. The second liquid phase 106a can be applied in such a way that an edge region 104r of the first layer 104 remains free of the liquid phase 106a.

As a result of the decrease in the volume of the second liquid phase 106a, the lateral extent thereof can likewise decrease slightly, such that the edge region 104r of the first layer 104 can increase slightly, e.g. in a range of approximately 1% to approximately 10%.

Furthermore, between the first layer 104 and the second layer 106, it is possible for further layer s (not illustrated) to be arranged, e.g. to be formed from a liquid phase, by means of solvents which do not incipiently dissolve the first layer 104 or incipiently dissolve it with difficulty (substantially do not incipiently dissolve it) and which are not incipiently dissolved by the second solvent or are incipiently dissolved by it with difficulty.

Figure 4C:
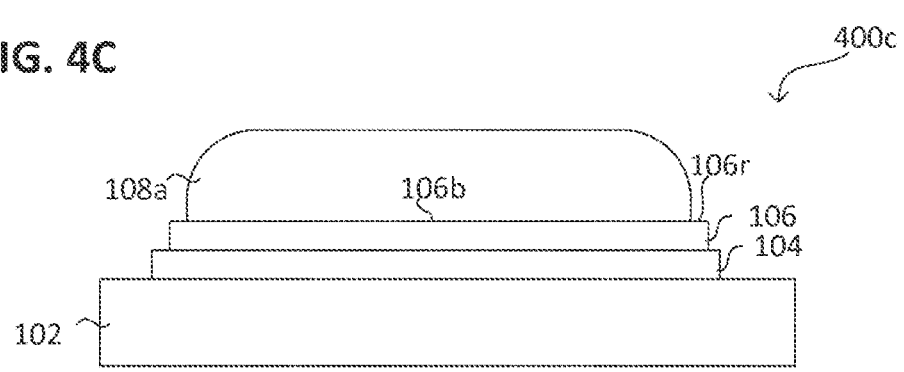

Analogously to the organic first layer 104, subsequently, by extracting the second solvent from the second liquid phase 106a, it is possible for the second liquid phase 106a to be converted into the organic second layer 106, as is illustrated in FIG. 4C.

As is illustrated in FIG. 4C, a substance for an organic third layer 108 (e.g. the electron injection layer, the electron conduction layer, the emitter layer, etc.) can be dissolved or dispersed in a third solvent, e.g. of a third solvent type, which is orthogonal to the second solvent, and a liquid phase 108a (in other words a solution) of the organic third layer 108 can be formed in the process, this also being referred to as third liquid phase 108a.

In accordance with various embodiments, the third solvent type can be identical to the first solvent type and orthogonal to the second solvent type. By way of example, the third solvent can be identical to the first solvent and orthogonal to the second solvent.

The third liquid phase 108a can be applied on the second layer 106, e.g. by means of liquid phase processing, e.g. on a region 106b to be coated of the organic second layer 106. The third liquid phase 108a can be applied in such a way that an edge region 106r of the second layer 106 remains free of the third liquid phase 108a.

Figure 4D:
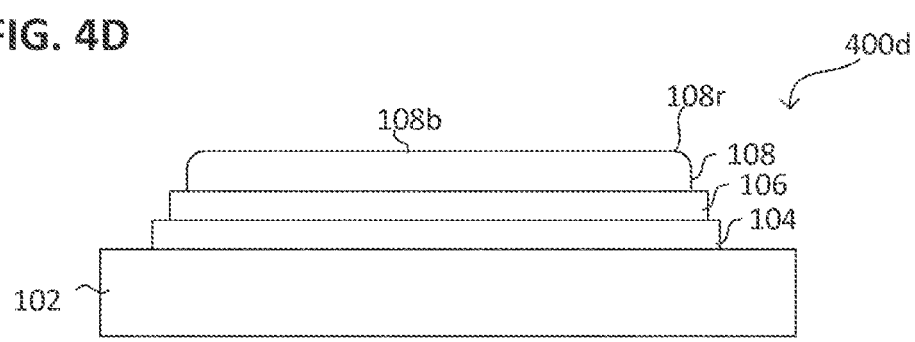

Analogously to the organic first layer 104, subsequently, by extracting the solvent from the third liquid phase 108a, it is possible for the third liquid phase 108a to be converted into the organic third layer 106, as is illustrated in FIG. 4D.

Analogously to the description above, between the second layer 106 and the third layer 108 it is possible for further layer s (not illustrated) to be arranged, e.g. to be formed from a liquid phase, by means of solvents which do not incipiently dissolve the second layer 106 or incipiently dissolve it with difficulty (substantially do not incipiently dissolve it) and which are not incipiently dissolved by the third solvent or are incipiently dissolved by it with difficulty.

Analogously to the description above, further liquid phases of organic layer s, e.g. a fourth organic layer (e.g. the electron conduction layer, the emitter layer, etc.), can be applied on a region 108b to be coated of the organic third layer 108 in such a way that an edge region 108r of the organic third layer 108 remains free of the liquid phase of the fourth organic layer. The fourth solvent (or the fourth solvent type of the fourth solvent) in which the substance of the fourth organic layer is dissolved can be orthogonal to the third solvent (or to the third solvent type). In addition, the fourth solvent (or the fourth solvent type of the fourth solvent) can be orthogonal to the second solvent (or to the second solvent type).

In accordance with various embodiments, for forming the layer s it is possible to use a plurality of different solvents (or solvent types), e.g. different solvents, which are orthogonal to one another respectively in pairs. In other words, it is possible to form respectively n layer s (layer 1, layer 2, . . . , layer n), wherein the solvents which are used for forming successive layer s are orthogonal to one another respectively in pairs.

If one of the solvents (or solvent types) used for forming a layer is repeated, i.e. if an existing layer is soluble in a solvent used for forming a further layer (if e.g. solvent 1 is used for forming the layer 1 and the layer n+1), these layer s are separated from one another by at least one layer m (can also be referred to as first layer). Optionally, at least one further layer can be arranged between the layer m and the layer n+1 and/or between the layer m and the layer 1.

The layer for which the solvent type is repeated is formed in such a way that the edge region of the layer m remains free of this layer. In other words, the layer n+1 is formed in the form of the second layer 106 and the layer m is formed in the form of the first layer. This makes it possible to prevent the liquid phase of the second layer from passing beyond the edge region and wetting and incipiently dissolving underlying layer s.

FIG. 5 illustrates a schematic plan view of an organic optoelectronic component 500 in accordance with various embodiments. FIG. 5 illustrates a lateral component architecture for a multilayered organic optoelectronic component 500, e.g. an OLED, by means of structured solution processing. In accordance with various embodiments, such a component architecture can be used for a rear-side emissive component, also referred to as a bottom emitter. That is to say that the organic optoelectronic component 500 emits light through the first electrode 310 and the substrate 102.

The organic optoelectronic component 500 may include a substrate 102, e.g. a transparent substrate 102, and a first electrode 310, e.g. composed of ITO, applied on the substrate 102. The first electrode 310 can be connected to a first contact area 510, e.g. in the form of a first contact pad.

Furthermore, the optoelectronic component 500 may include a functional layer structure 312 applied on the first electrode 310. The functional layer structure 312 can be formed as a layer stack including a plurality of organic layer s, e.g. as described above for the organic optoelectronic component 300a or the organic optoelectronic component 300b.

The functional layer structure 312 can have a thickness (i.e. the sum of the layer thicknesses of the individual layer s) in a range of approximately 100 nm to approximately 400 nm.

The layer stack can be formed in such a way that the edge region 104r of the organic first layer 104, the edge region 106r of the organic second layer 106, the edge region 108r of the organic third layer 108, the edge region 504r of an organic fourth layer and the edge region 506r of an organic fifth layer remain free of the succeeding layer, e.g. are exposed. In other words, each layer of the functional layer structure 312 may include an exposed edge region 104r, 106r, 108r, 504r, 506r.

Consequently, the coated regions of the layer s of the functional layer structure 312 can be arranged respectively one in another, when projected onto a plane parallel to the main processing surface of the substrate 102.

Illustratively, the layer stack can be formed in the shape of a pyramid, e.g. in a stepped fashion, wherein each layer of the layer stack can form a step.

Furthermore, the optoelectronic component 500 may include a second electrode 314 applied on the functional layer structure 312. The second electrode 314 can be connected to a second contact area 514, e.g. in the form of a second contact pad (e.g. composed of ITO, Cr, Al or Mo). The second contact area 514 can be applied on the substrate 102 alongside the first electrode 310 and in a manner electrically insulated therefrom.

The second electrode 314 can be formed e.g. by means of vacuum processing. Furthermore, the second electrode 314 can be formed in such a way that the edge region 506r of the fifth organic layer of the functional layer structure 312 remains free of the second electrode 314.

Furthermore, the optoelectronic component 500 may include a second insulation layer 502, which is arranged above or on the first electrode 310 and partly covers the latter. The insulation layer 502 can be formed for example in the form of a barrier layer 304 (see FIG. 3C).

In accordance with various embodiments, the insulation layer 502 can be formed for example from an electrically insulating substance (a so-called electrical insulator). In accordance with various embodiments, the insulation layer 502 can be electrically insulating.

The insulation layer 502 can be extended for example between the first electrode 310 and the functional layer structure 312. The insulation layer 502 can be extended for example between the first electrode 310 and the sixth organic layer of the layer structure 312, which can also be referred to as the topmost organic layer of the layer structure 312 if the latter adjoins the second electrode 314.

The layer thickness of the insulation layer 502 is in a range of a few nanometers (nm) to a few micrometers (μm), e.g. in a range of approximately 100 nm to approximately 5 μm, e.g. in a range of approximately 100 nm to approximately 1 μm. The thinner the insulation layer 502 is formed, the smaller an edge can be which has to be surmounted by the layer s of the optically functional layer structure that are formed thereabove.

In accordance with various embodiments, the lateral extent of the insulation layer 502 can reach right into a region above or on which all the organic layer s are formed (e.g. perpendicular to the lateral extent). This makes it possible to prevent the entire voltage drop from being effected in the region in which only a few organic layer s are arranged between the first electrode 310 and the second electrode 314. In other words, the insulation layer 502 serves as an electrical insulator which electrically insulates the first electrode 310 from the second electrode 314, independently of the number of layer s of the layer structure 312.

In accordance with various embodiments, the insulation layer 502 overlaps the first electrode 310, wherein the region with which the insulation layer 502 and the first electrode 310 overlap has a width 512u in a range of approximately 100 μm to approximately 500 μm, e.g. approximately 300 μm.

In accordance with various embodiments, the insulation layer 502 extends beyond the first layer 104, wherein the region projecting beyond the first layer 104 has a width 512h in a range of approximately 100 μm to approximately 500 μm, e.g. approximately 300 μm.

The lateral width of the insulation layer 502 can have a value in a range of approximately 200 μm to approximately 2000 μm, e.g. in a range of approximately 600 μm to approximately 1000 μm.

In accordance with various embodiments, the organic optoelectronic component 500 can be formed as a front-side emissive component, as a so-called top emitter, that is to say that the organic optoelectronic component 500 emits light through the second electrode 314. In the case of a top emitter, the second electrode 314 (top electrode) can be formed as transparent.

In accordance with various embodiments, the organic optoelectronic component 500 can be formed as a transparent component, i.e. as a combination of top emitter and bottom emitter. In the case of a transparent component, the first electrode 310 and the second electrode 314 can be formed as transparent.

The topmost layer of the optically functional layer structure 312 (e.g. the fifth layer) can define the luminous area of the optoelectronic component 500, i.e. the area which emits light. By way of example, the luminous area of the optoelectronic component 500 can correspond to the area of the topmost layer of the layer stack, e.g. of the fifth layer. Therefore, it may be necessary, for a predefined luminous area, to form the bottommost layer of the layer stack, e.g. the first layer 104, to be correspondingly larger than the predefined luminous area in a lateral direction, e.g. larger laterally by at least the extents of the respective edge regions of the layer s formed thereabove.

The luminous area of the optoelectronic component can have a value in a range of approximately a few square centimeters ($cm^2$) to approximately a few hundred square centimeters, e.g. in a range of approximately 1 $cm^2$ to approximately 500 $cm^2$, e.g. in a range of approximately 10 $cm^2$ to approximately 500 $cm^2$, e.g. in a range of approximately 100 $cm^2$ to approximately 500 $cm^2$.

FIG. 6 illustrates a schematic plan view of an organic optoelectronic component 600 in accordance with various embodiments. The organic optoelectronic component 600 illustrated in FIG. 6 can be formed analogously to the organic optoelectronic component 500 illustrated in FIG. 5, with the difference that the insulation layer 502 is extended between the second electrode 310 and the functional layer structure 312.

Alternatively or additionally, one of the organic optoelectronic components described herein may include a color filter and/or a converter structure, which can be arranged and/or formed above or on the substrate 102. By means of targeted variation of a surface in the case of planar substrates (variation of the bottom contact or single-sided coating or application of a color filter or of a converter), it is possible to achieve a targeted change in the emission in one direction, independently of the emission in the other direction. This applies to nontransparent and (semi) transparent embodiments.

The layer thickness of the insulation layer 502 is in a range of a few nanometers (nm) to a few micrometers (μm), e.g. in a range of approximately 100 nm to approximately 5 μm, e.g. in a range of approximately 1 μm to approximately 5 μm. The thicker the insulation layer 502 is formed, the smaller the influence which the edge regions formed in a stepped fashion can have on the second electrode 314 formed thereabove. In other words, a step height that has to be surmounted by the second electrode 314 can be smaller, the larger the layer thickness of the insulation layer 502.

Figure 7:
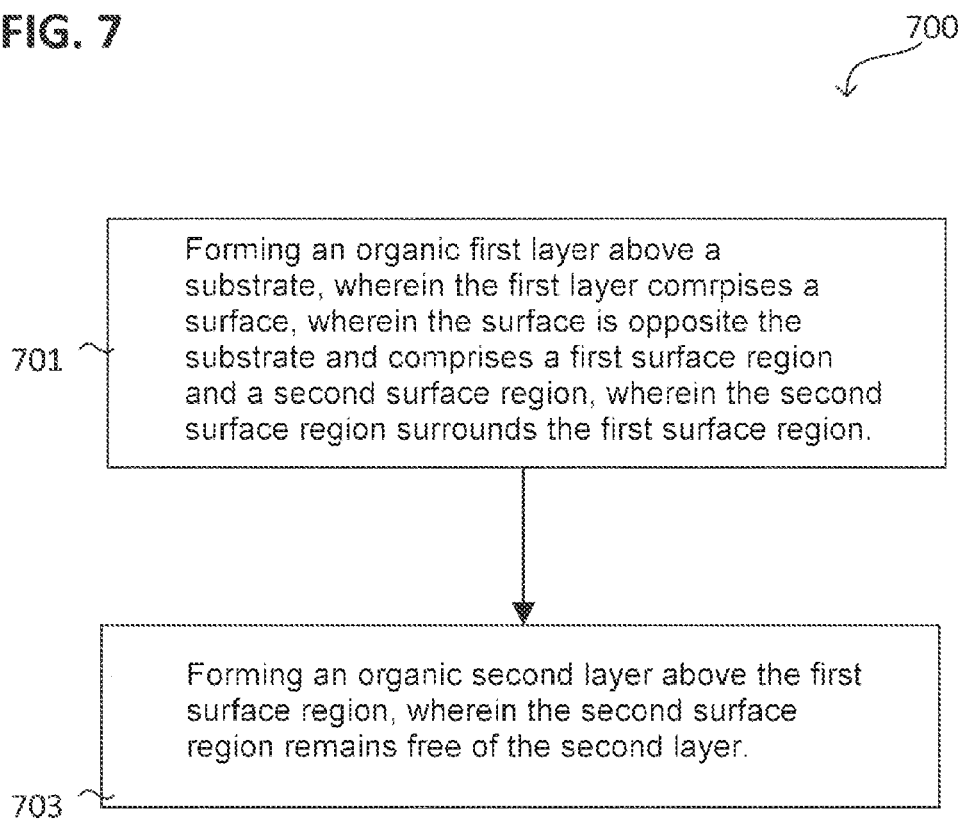
FIG. 7 shows a method in accordance with various embodiments for producing an organic optoelectronic component.

FIG. 7 illustrates a method 700 in accordance with various embodiments for producing an organic optoelectronic component, e.g. one of the optoelectronic components described above.

The method may include, in 701, forming an organic first layer above or on a substrate, wherein the first layer includes a surface, wherein the surface is opposite the substrate and includes a first surface region and a second surface region, wherein the second surface region partly or completely surrounds the first surface region. Furthermore, the method may include, in 703, forming an organic second layer above or on the first surface region, wherein the second surface region remains free of the second layer.

Retrospectively, on the basis of an analysis of the optoelectronic component, it is possible to determine what solvents (or solvent types) would be suitable for producing a present layer stack of the optoelectronic component. By way of example, on the basis of the material of individual layer s of the layer stack, it is possible to determine whether they are soluble in a polar or apolar solvent. By way of example, the material can be determined by a physical element analysis and/or a chemical elementary analysis, e.g. by means of mass spectroscopy, nuclear spin resonance, mass spectroscopy (e.g. secondary ion mass spectrometry) or some other suitable spectroscopy method. On the basis of the material, it is possible to draw conclusions about suitable solvents or solvent types.

FIG. 8 illustrates a method 800 in accordance with various embodiments for producing a layer stack (cf. for example FIG. 1A or FIG. 4A to FIG. 4D), e.g. in an organic optoelectronic component, e.g. one of the optoelectronic components described above.

The method may include, in 801, forming a first layer from a first solution above a substrate, wherein the first layer includes a surface; wherein the surface is opposite the substrate and includes a first surface region and a second surface region, wherein the second surface region surrounds the first surface region. The method may include, in 803, forming a second layer from a second solution above the first surface region, wherein the second surface region remains free of the second layer.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, the method comprising:
    forming an organic first layer above a substrate, wherein the first layer comprises a surface;
    wherein the surface is opposite the substrate and comprises a first surface region and a second surface region, wherein the second surface region surrounds the first surface region;
    forming an organic second layer as second layer above the first surface region,
    wherein the second surface region remains free of the second layer;
    wherein the first layer and the second layer differ in their chemical composition.

2. The method as claimed in claim 1,
    wherein the second layer comprises a solvent configured in such a way that it substantially does not dissolve a material of the first layer.

3. The method as claimed in claim 1,
    wherein successively formed layers are processed from solvents respectively orthogonal to one another.

4. The method as claimed in claim 1,
    wherein the first layer comprises a solvent which is orthogonal to the solvent of the second layer.

5. The method as claimed in claim 1,
wherein the first layer and the second layer are part of an organic light emitting diode.

6. The method as claimed in claim 1,
wherein the first layer and/or the second layer are/is part of an optically functional layer structure configured for converting electrical energy into electromagnetic radiation.

7. The method as claimed in claim 1,
wherein the first layer and/or the second layer are/is formed as a dissolving stop layer,
wherein the dissolving stop layer has a layer thickness of less than 20 nm.

8. The method as claimed in claim 1,
wherein the first layer and/or the second layer are/is formed as a metallization layer,
wherein the metallization layer comprises exposed contact regions.

9. The method as claimed in claim 1, further comprising:
forming an encapsulation above the substrate, which encapsulation covers the first layer and the second layer.

10. The method as claimed in claim 1,
wherein wherein the first and second layers form a stair-stepped multi-layer structure.

11. The method as claimed in claim 2,
wherein the material of the first layer is a solvent of the first layer or is an organic material of the first layer which is dissolved in the solvent of the first layer.

12. The method as claimed in claim 2,
wherein successively formed layers are processed from solvents respectively orthogonal to one another.

13. The method as claimed in claim 2,
wherein the first layer comprises a solvent which is orthogonal to the solvent of the second layer.

14. The method as claimed in claim 3,
wherein the solvent of the first layer and the solvent of the second layer are in each case from the following group of solvent types:
polar solvent,
perfluorinated solvent,
aprotic polar solvent,
hydroxylic solvent, or
apolar organic solvent.

15. The method as claimed in claim 3,
wherein forming the first layer comprises extracting the solvent of the first layer at least partly from the layer in order to dry the first layer before the second layer is formed.

16. An optoelectronic component comprising:
a substrate;
an organic first layer, wherein the first layer comprises a surface;
wherein the surface is opposite the substrate and comprises a first surface region and a second surface region, wherein the second surface region surrounds the first surface region; and
an organic second layer above the first surface region, wherein the second surface region is free of the second layer;
wherein the first layer and the second layer differ in their chemical composition.

17. The optoelectronic component as claimed in claim 16, wherein the second layer comprises a material which is soluble in a solvent, and wherein the first layer comprises a material which is substantially insoluble in the solvent.

18. The optoelectronic component as claimed in claim 16, wherein the first layer comprises a solvent which is orthogonal to the solvent of the second layer.

19. A method for producing a layer stack, the method comprising:
forming a first layer from a first solution above a substrate, wherein the first layer comprises a surface;
wherein the surface is opposite the substrate and comprises a first surface region and a second surface region, wherein the second surface region surrounds the first surface region;
forming a second layer from a second solution above the first surface region,
wherein the second surface region remains free of the second layer;
wherein the first layer and the second layer differ in their chemical composition.

20. The method as claimed in claim 19,
wherein the second layer comprises a solvent configured in such a way that it substantially does not dissolve a material of the first layer and/or wherein successively formed layers are processed from solvents respectively orthogonal to one another.

* * * * *

UNITED STATES PATENT AND TRADEMARK OFFICE
CERTIFICATE OF CORRECTION

PATENT NO. : 10,236,445 B2
APPLICATION NO. : 15/557835
DATED : March 19, 2019
INVENTOR(S) : Nina Riegel and Arne Fleissner Page 1 of 1

It is certified that error appears in the above-identified patent and that said Letters Patent is hereby corrected as shown below:

In the Claims

Column 29, Line 25, Claim 10: Please delete "wherein wherein the first and second" and insert --, wherein the first and second-- in place thereof.

Signed and Sealed this
Second Day of July, 2019

Andrei Iancu
*Director of the United States Patent and Trademark Office*